(12) United States Patent
Bertin

(10) Patent No.: US 7,405,605 B2
(45) Date of Patent: Jul. 29, 2008

(54) STORAGE ELEMENTS USING NANOTUBE SWITCHING ELEMENTS

(75) Inventor: Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 11/651,263

(22) Filed: Jan. 9, 2007

(65) Prior Publication Data

US 2007/0210845 A1    Sep. 13, 2007

Related U.S. Application Data

(62) Division of application No. 11/032,983, filed on Jan. 10, 2005, now Pat. No. 7,161,403.

(60) Provisional application No. 60/581,301, filed on Jun. 18, 2004.

(51) Int. Cl.
*H03K 3/289* (2006.01)
*H03K 3/356* (2006.01)

(52) U.S. Cl. ............ 327/199; 327/200; 327/202; 327/203; 327/208; 327/218

(58) Field of Classification Search ............ None
See application file for complete search history.

(56) References Cited

U.S. PATENT DOCUMENTS

| | | |
|---|---|---|
| 4,044,343 A | 8/1977 | Uchida |
| 4,979,149 A | 12/1990 | Popovic et al. |
| 5,414,654 A | 5/1995 | Kubota et al. |
| 5,578,976 A | 11/1996 | Yao |
| 5,677,823 A | 10/1997 | Smith |
| 5,682,345 A | 10/1997 | Roohparvar et al. |
| 5,818,748 A | 10/1998 | Bertin et al. |

(Continued)

FOREIGN PATENT DOCUMENTS

GB    2364933    2/2002

(Continued)

OTHER PUBLICATIONS

Bernholc et al., "Mechanical and electrical properties of nanotubes", Ann. Rev. Mater. Res., vol. 32, p. 347, 2002.

(Continued)

*Primary Examiner*—Tuan T Lam
(74) *Attorney, Agent, or Firm*—Wilmer Cutler Pickering Hale and Dorr LLP

(57) ABSTRACT

Data storage circuits and components of such circuits constructed using nanotube switching elements. The storage circuits may be stand-alone devices or cells incorporated into other devices or circuits. The data storage circuits include or can be used in latches, master-slave flip-flops, digital logic circuits, memory devices and other circuits. In one aspect of the invention, a master-slave flip-flop is constructed using one or more nanotube switching element-based storage devices. The master storage element or the slave storage element or both may be constructed using nanotube switching elements, for example, using two nanotube switching element-based inverters. The storage elements may be volatile or non-volatile. An equilibration device is provided for protecting the stored data from fluctuations on the inputs. Input buffers and output buffers for data storage circuits of the invention may also be constructed using nanotube switching elements.

6 Claims, 22 Drawing Sheets

U.S. PATENT DOCUMENTS

| | | | |
|---|---|---|---|
| 6,097,241 | A | 8/2000 | Bertin et al. |
| 6,097,243 | A | 8/2000 | Bertin et al. |
| 6,128,214 | A | 10/2000 | Kuekes et al. |
| 6,136,160 | A | 10/2000 | Hrkut et al. |
| 6,159,620 | A | 12/2000 | Heath et al. |
| 6,160,230 | A | 12/2000 | McMillan et al. |
| 6,183,714 | B1 | 2/2001 | Smalley et al. |
| 6,198,655 | B1 | 3/2001 | Heath et al. |
| 6,221,330 | B1 | 4/2001 | Moy et al. |
| 6,232,706 | B1 | 5/2001 | Dai et al. |
| 6,256,767 | B1 | 7/2001 | Kuekes et al. |
| 6,314,019 | B1 | 11/2001 | Kuekes et al. |
| 6,345,362 | B1 | 2/2002 | Bertin et al. |
| 6,346,846 | B1 | 2/2002 | Bertin et al. |
| 6,353,552 | B2 | 3/2002 | Sample et al. |
| 6,373,771 | B1 | 4/2002 | Fifield et al. |
| 6,376,787 | B1 | 4/2002 | Martin et al. |
| 6,422,450 | B1 | 7/2002 | Zhou et al. |
| 6,423,583 | B1 | 7/2002 | Avouris et al. |
| 6,426,687 | B1 | 7/2002 | Osborn |
| 6,445,006 | B1 | 9/2002 | Brandes et al. |
| 6,518,156 | B1 | 2/2003 | Chen et al. |
| 6,528,020 | B1 | 3/2003 | Dai et al. |
| 6,548,841 | B2 | 4/2003 | Frazier et al. |
| 6,559,468 | B1 | 5/2003 | Kuekes et al. |
| 6,574,130 | B2 | 6/2003 | Segal et al. |
| 6,597,048 | B1 | 7/2003 | Kan |
| 6,625,047 | B2 | 9/2003 | Coleman, Jr. |
| 6,625,740 | B1 | 9/2003 | Datar et al. |
| 6,643,165 | B2 | 11/2003 | Segal et al. |
| 6,661,270 | B2 | 12/2003 | Nagata |
| 6,673,424 | B1 | 1/2004 | Lindsay et al. |
| 6,706,402 | B2 | 3/2004 | Rueckes et al. |
| 6,706,566 | B2 | 3/2004 | Avouris et al. |
| 6,707,098 | B2 | 3/2004 | Hofmann et al. |
| 6,741,334 | B2 | 5/2004 | Asano et al. |
| 6,750,471 | B2 | 6/2004 | Bethune et al. |
| 6,759,693 | B2 | 7/2004 | Vogeli et al. |
| 6,774,052 | B2 | 8/2004 | Vogeli et al. |
| 6,781,166 | B2 | 8/2004 | Lieber et al. |
| 6,784,028 | B2 | 8/2004 | Rueckes et al. |
| 6,794,914 | B2 | 9/2004 | Sani et al. |
| 6,803,260 | B2 | 10/2004 | Shin et al. |
| 6,803,840 | B2 | 10/2004 | Hunt et al. |
| 6,808,746 | B1 | 10/2004 | Dai et al. |
| 6,809,462 | B2 | 10/2004 | Pelrine et al. |
| 6,809,465 | B2 | 10/2004 | Jin |
| 6,894,541 | B2 * | 5/2005 | Nautiyal et al. ............ 327/55 |
| 6,899,945 | B2 | 5/2005 | Smalley et al. |
| 6,918,284 | B2 | 7/2005 | Snow et al. |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,990,009 | B2 | 1/2006 | Bertin et al. |
| 7,015,500 | B2 | 3/2006 | Choi et al. |
| 7,115,901 | B2 | 10/2006 | Bertin et al. |
| 7,115,960 | B2 | 10/2006 | Bertin et al. |
| 7,161,403 | B2 | 1/2007 | Bertin |
| 7,193,447 | B1 * | 3/2007 | Liu et al. ............ 327/57 |
| 7,279,939 | B2 * | 10/2007 | Burleson et al. ............ 327/51 |
| 2001/0023986 | A1 | 9/2001 | Mancevski |
| 2002/0130311 | A1 | 9/2002 | Lieber et al. |
| 2002/0130353 | A1 | 9/2002 | Lieber |
| 2002/0172963 | A1 | 11/2002 | Kelley et al. |
| 2002/0173083 | A1 | 11/2002 | Avouris et al. |
| 2002/0175390 | A1 | 11/2002 | Goldstein et al. |
| 2002/0179434 | A1 | 12/2002 | Dai et al. |
| 2003/0018630 | A1 | 1/2003 | Indeck et al. |
| 2003/0021141 | A1 | 1/2003 | Segal et al. |
| 2003/0021966 | A1 | 1/2003 | Segal et al. |
| 2003/0022428 | A1 | 1/2003 | Segal et al. |
| 2003/0124325 | A1 | 7/2003 | Rueckes et al. |
| 2003/0124837 | A1 | 7/2003 | Rueckes et al. |
| 2003/0132823 | A1 | 7/2003 | Hyman et al. |
| 2003/0165074 | A1 | 9/2003 | Segal et al. |
| 2003/0177450 | A1 | 9/2003 | Nugent |
| 2003/0199172 | A1 | 10/2003 | Rueckes et al. |
| 2003/0200521 | A1 | 10/2003 | DeHon et al. |
| 2003/0206436 | A1 | 11/2003 | Eaton et al. |
| 2003/0234407 | A1 | 12/2003 | Vogeli et al. |
| 2003/0236000 | A1 | 12/2003 | Vogeli et al. |
| 2004/0023514 | A1 | 2/2004 | Moriya et al. |
| 2004/0041154 | A1 | 3/2004 | Watanabe et al. |
| 2004/0043527 | A1 | 3/2004 | Bradley et al. |
| 2004/0067602 | A1 | 4/2004 | Jin |
| 2004/0075125 | A1 | 4/2004 | Asao |
| 2004/0075159 | A1 | 4/2004 | Vogeli |
| 2004/0077107 | A1 | 4/2004 | Vogeli |
| 2004/0085805 | A1 | 5/2004 | Segal et al. |
| 2004/0087162 | A1 | 5/2004 | Vogeli |
| 2004/0099438 | A1 | 5/2004 | Arthur et al. |
| 2004/0104129 | A1 | 6/2004 | Gu et al. |
| 2004/0159833 | A1 | 8/2004 | Rueckes et al. |
| 2004/0164289 | A1 | 8/2004 | Rueckes et al. |
| 2004/0175856 | A1 | 9/2004 | Jaiprakash et al. |
| 2004/0181630 | A1 | 9/2004 | Jaiprakash et al. |
| 2004/0191978 | A1 | 9/2004 | Rueckes et al. |
| 2004/0197978 | A1 | 10/2004 | Dobler et al. |
| 2004/0198030 | A1 | 10/2004 | Buehrer et al. |
| 2004/0214366 | A1 | 10/2004 | Segal et al. |
| 2004/0214367 | A1 | 10/2004 | Segal et al. |
| 2004/0238907 | A1 | 12/2004 | Pinkerton et al. |
| 2005/0007002 | A1 | 1/2005 | Golovchenko et al. |
| 2005/0035344 | A1 | 2/2005 | Bertin et al. |
| 2005/0035367 | A1 | 2/2005 | Bertin et al. |
| 2005/0035786 | A1 | 2/2005 | Bertin et al. |
| 2005/0035787 | A1 | 2/2005 | Bertin et al. |
| 2005/0036365 | A1 | 2/2005 | Bertin et al. |
| 2005/0037547 | A1 | 2/2005 | Bertin et al. |
| 2005/0040874 | A1 | 2/2005 | Allison et al. |
| 2005/0056877 | A1 | 3/2005 | Rueckes et al. |
| 2006/0250843 | A1 | 11/2006 | Bertin et al. |
| 2006/0250856 | A1 | 11/2006 | Bertin et al. |
| 2006/0258122 | A1 | 11/2006 | Whitefield et al. |
| 2006/0264053 | A1 | 11/2006 | Yates |
| 2006/0281256 | A1 | 12/2006 | Carter et al. |
| 2006/0281287 | A1 | 12/2006 | Yates et al. |
| 2006/0292716 | A1 | 12/2006 | Gu et al. |

FOREIGN PATENT DOCUMENTS

| | | |
|---|---|---|
| JP | 2004-090208 | 3/2004 |
| WO | WO-00/48195 | 8/2000 |
| WO | WO-01/03208 A1 | 1/2001 |
| WO | 03091486 | 11/2003 |
| WO | 2004065655 | 8/2004 |
| WO | 2004065657 | 8/2004 |
| WO | 2004065671 | 8/2004 |

OTHER PUBLICATIONS

Bradley, K. et al., "Flexible Nanotube Electronics", Nano Letters, vol. 3, No. 10, pp. 1353-1355. 2003.

Collins, et al., Engineering Carbon Nanotubes and Nanotube Circuits Using Electrical Breakdown, Science, vol. 292, pp. 706-709, Apr. 2001.

Kinaret, J. M. et al,, "A Carbon-nanotube-based nanorelay," Applied Physics Letters, Feb. 24, 2003, vol. 82, No. 8, pp. 1287-1289.

Martel, R., et al, "Carbon Nanotube Field-Effect Transistors and Logic Circuits," DAC 2002, Jun. 10-12, 2002, vol. 7.4, pp. 94-98.

Onoa et al., "Bulk Production of singly dispersed carbon nanotubes with prescribed lengths", Nanotechnology, vol. 16, pp. 2799-2803, 2005.

Stadermann, M. et al., "Nanoscale study of conduction through carbon nanotube networks", Phys. Rev. B 69 , 201402(R), 2004.

U.S. Appl. No. 11/280,786, Bertin.
U.S. Appl. No. 11/835,583, Bertin.
U.S. Appl. No. 11/835,613, Bertin.
U.S. Appl. No. 11/835,651, Bertin.
Avouris, "Carbon nanotube electronics", Chemical Physics, vol. 281, pp. 429-445, 2002.
Bachtold, A. et al., "Logic Circuits with Carbon Nanotube Transistors", Science, Nov. 9, 2001, vol. 294, pp. 1317-1320.
Chen, J. et al., "Self-aligned carbon nanotube transistors with charge transfer doping", Applied Physics Letters, vol. 86, pp. 123108-1-123108-3, 2005.
Chen, J. et al., "Self-aligned Carbon Nanotube Transistors with Novel Chemical Doping", IEDM, pp. 29.4.1-29.4.4, 2004.
Derycke, V. et al., "Controlling doping and carrier injection in carbon nanotube transistors", Applied Physics Letters, vol. 80, No. 15, pp. 2773-2775, Apr. 15, 2002.
Derycke, V., et al., "Carbon Nanotube Inter- and Intramolecular Logic Gates," Nano Letters, Sep. 2001, vol. 1, No. 9, pp. 453-456.
Duan, X. et al., "Nonvolatile Memory and Programmable Logic from Molecule-Gated Nanowires", Nano Letters, vol. 0, No. 0, pp. A-D, 2002.
Heinze, S. et al., "Carbon Nanotubes as Schottky Barrier Transistors", Physical Review Letters, vol. 89, No. 10, pp. 16801-1-106801-4, 2002.
Hone, J., "Phonons and Thermal Properties of Carbon Nanotubes", Carbon Nanotubes, Topics Appl. Phys., vol. 80, pp. 273-286, 2001.
Huang, Y., et al,, "Logic Gates and Computation from Assembled Nanowire Building Blocks," Science, Nov. 9, 2001, vol. 294, pp. 1313-1316.
Javey, A. et al., "Carbon Nanotube Field-Effect Transistors with Integrated Ohmic Contacts and High-k Gate Dielectrics", Nano Letters, vol. 4, No. 3, pp. 447-450, 2004.
Javey, A. et al., "High-k dielectrics for advanced carbon-nanotube transistors and logic gates", Nature Materials, vol. 1, pp. 241-246, Dec. 2002.
Javey, A., et al., "Carbon Nanotube Transistor Arrays for Multistage Complementary Logic and Ring Oscillators," Nano Letters, 2002, vol. 2, No. 9, pp. 929-932.
Johnson, R. Collin, "IBM fellow unrolls blueprint for nano", *EETimes*, Mar. 6, 2006, 3 pages, http://www.eetimes.com/showArticle.jhtml?articleID=181500304.
Kong, J. et al., "Quantum Interference and Ballistic Transmission in Nanotube Electron Waveguides", The American Physical Society, vol. 87, No. 10, pp. 106801-1-106801-4, Sep. 3, 2001.
Lin, Y.M. et al., "Novel Carbon Nanotube FET Design with Tunable Polarity", IEDM, pp. 29.2.1-29.2.4, 2004.
Onoa, G.B. et al., "Bulk production of singly dispersed carbon nanotubes with prescribed lengths," Nanotechnology, vol. 16, pp. 2799-2803, 2005.
Radosavljevic, et al., "Nonvolatile molecular memory elements based on ambipolar nanotube field effect transistors", Nano Letters, vol. 2, No. 7, pp. 761-764, 2002.
Rueckes, et al., "Carbon nanotube-based nonvolatile random access memory for molecular computing", *Science*, vol. 289, pp. 94-97, Jul. 7, 2000.
Wind, S. J. et al., "Fabrication and Electrical Characterization of Top Gate Single-Wall Carbon Nanotube Field-Effect Transistors", 14 pages.
Wind, S. J. et al., "Vertical scaling of carbon nanotube field-effect transistors using top gate electrodes", Applied Physics Letters, vol. 80, No. 20, pp. 3817-3819, May 20, 2002.

\* cited by examiner

STORAGE ELEMENTS USING NANOTUBE SWITCHING ELEMENTS

CROSS-REFERENCE TO RELATED APPLICATIONS

This application is a divisional application of and claims the benefit of U.S. patent application Ser. No. 11/032,983 filed Jan. 10, 2005, now U.S. Pat. No. 7,161,403 entitled Storage Elements Using Nanotube Switching Elements, the entire contents of which are incorporated herein by reference, which claims the benefit of U.S. Provisional Patent Application No. 60/581,301 filed Jun. 18, 2004, entitled Nonvolatile Carbon Nanotube Logic (NLOGIC) Master-Slave Latches, the entire contents of which are incorporated herein by reference.

This application is related to the following applications:

U.S. patent application Ser. No. 10/917,794, filed on Aug. 13, 2004, now U.S. Pat. No. 7,115,960, entitled Nanotube-Based Switching Elements;

U.S. patent application Ser. No. 10/918,085, filed on Aug. 13, 2004, now U.S. Pat. No. 6,990,009, entitled Nanotube-Based Switching Elements With Multiple Controls;

U.S. patent application Ser. No. 10/918,181, filed on Aug. 13, 2004, now U.S. Pat. No. 7,071,023, entitled Nanotube Device Structure And Methods Of Fabrication;

U.S. patent application Ser. No. 10/917,893, filed on Aug. 13, 2004, now U.S. Pat. No. 7,138,832, entitled Nanotube-Based Switching Elements And Logic Circuits;

U.S. patent application Ser. No. 10/917,606, filed on Aug. 13, 2004, entitled Isolation Structure For Deflectable Nanotube Elements;

U.S. patent application Ser. No. 10/917,932, filed on Aug. 13, 2004, entitled Circuits Made From Nanotube-Based Switching Elements With Multiple Controls;

U.S. patent application Ser. No. 11/083,087, filed on Jan. 10, 2005, entitled Nanotube-Based Transfer Devices and Related Circuits;

U.S. patent application Ser. No. 11/033,089, filed on Jan. 10, 2005, now U.S. Pat. No. 7,288,970 entitled Integrated Nanotube and Field Effect Switching Device;

U.S. patent application Ser. No. 11/033,213, filed on Jan. 10, 2005, now U.S. Pat. No. 7,329,931 entitled Receiver Circuit Using Nanotube-Based Switches and Transistors;

U.S. patent application Ser. No. 11/033,215, filed on Jan. 10, 2005, now U.S. Pat. No. 7,330,709 entitled Receiver Circuit Using Nanotube-based Switches and Logic;

U.S. patent application Ser. No. 11/033,216, filed on Jan. 10, 2005, now U.S. Pat. No. 7,164,744 entitled Nanotube-based Logic Driver Circuits; and U.S. patent application Ser. No. 11/032,823, filed on Jan. 10, 2005, now U.S. Pat. No. 7,167,026 entitled Tri-State Circuit Using Nanotube Switching Elements.

FIELD OF THE INVENTION

This invention relates generally to storage elements and devices for digital logic circuits and more particularly to storage elements that incorporate nanotube switching elements.

DISCUSSION OF RELATED ART

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environments. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to certain extreme environments because electrical currents are generated inside the semiconductor material. It is possible to manufacture integrated circuits with special devices and isolation techniques so that they remain operational when exposed to such environments, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electro-mechanical switches based on carbon nanotubes (including mono-layers constructed thereof) and metal electrodes has been detailed in previous patent applications of Nantero, Inc. (U.S. Pat. Nos. 6,574,130, 6,643,165, 6,706,402, 6,784,028, 6,835,591, 6,911,682, 6,919,592, 6,924,538, 6,990,009 and 7,115,960; and U.S. patent application Ser. Nos. 10/341,005, 10/341,055, 10/341,054, 10/341,130 and 10/776,059), the contents of which are hereby incorporated by reference in their entireties.

SUMMARY OF THE INVENTION

The invention provides data storage circuits and components of such circuits constructed using nanotube switching elements. The storage circuits may be stand-alone devices or cells incorporated into other devices or circuits. The data storage circuits include or can be used in latches, master-slave flip-flops, digital logic circuits, memory devices and other circuits.

In one aspect of the invention, a master-slave flip-flop is constructed using one or more nanotube switching element-based storage devices. One embodiment of a master-slave flip-flop circuit includes a differential data input, a first clock input and a second clock input for providing non-overlapping first and second clock signals and a first input buffer coupled to the differential data input and the first clock input for gating the differential data input under the control of the first clock input. The master storage element is coupled to the input buffer for storing a first data value representative of the differential data input. The master storage element is constructed of at least one nanotube switching element. A second input buffer is coupled to the master storage element and the second clock input for gating the intermediate differential data value under the control of the second clock input. The slave storage element is coupled to the second input buffer for storing a second data value representative of the first data value. The slave storage element is constructed of at least one nanotube switching element. A differential data output is coupled to the slave storage element. In preferred embodiments, all of the components of a master-slave latch are constructed using nanotube switching elements (and appropriate interconnections, and connections to Vdd and GND), without the use of MOS or similar field effect devices. In other embodiments, a master-slave latch may use a combination of nanotube switching elements and other switching elements, including MOS field effect devices.

In one aspect of the invention, the master storage element and the slave storage element are non-volatile.

In another aspect of the invention, the master storage element and the slave storage element are constructed using non-volatile four-terminal nanotube switching elements.

In another aspect of the invention, the master storage element and the slave storage element are volatile.

In another aspect of the invention, the master storage element and the slave storage element are constructed using volatile three-terminal nanotube switching elements.

In another aspect of the invention, at least one of the master storage element or the slave storage element is constructed using two nanotube switching element-based inverters.

In another aspect of the invention, the first nanotube switching element-based inverter and the second nanotube switching element-based inverter are cross-coupled.

In another aspect of the invention, either the first input buffer or the second input buffer or both are provided by a nanotube switching element-based tri-stating inverter.

In another aspect of the invention, either the first input buffer or the second input buffer or both are provided by a single nanotube switching element.

In another aspect of the invention, an output driver circuit is coupled between the slave storage element and the differential output. In preferred embodiments, the output driver circuit is constructed using nanotube switching elements.

In another aspect of the invention, a data storage cell is constructed using nanotube switching elements. One embodiment of a data storage cell of the invention includes a first input for receiving a first input signal and a second input for receiving a second input signal complementary to the first input signal; a first inverter constructed using nanotube switching elements, the first inverter having a first control input and a first output; and a second inverter constructed using nanotube switching elements, the second inverter having a second control input and a second output. The first control input is coupled to the first input and the second control input is coupled to the second input. The first inverter stores a first data value and the second inverter stores a second data value provided via the first input and the second input respectively.

In one aspect of the invention, the first data value and the second data value correspond to a differential data value of a differential data signal coupled to the first input and the second input. The values are complementary and the circuit effectively stores a single data bit.

In another aspect of the invention, the first data value and the second data value are independent and the circuit effectively stores two data bits.

In another aspect of the invention, the first inverter and the second inverter are volatile.

In another aspect of the invention, the first inverter and the second inverter are cross-coupled.

In another aspect of the invention, the nanotube switching elements are three-terminal devices.

In another aspect of the invention, the first inverter and the second inverter are non-volatile.

In another aspect of the invention, the nanotube switching elements are four-terminal devices.

In another aspect of the invention, the first inverter includes a first release input and the second inverter includes a second release input, the first release input is coupled to the second input and the second release input is coupled to the first input.

In another aspect of the invention, a storage device includes a storage element constructed using at least one nanotube switching element having a control electrode and a release electrode, and an equilibration device responsive to a control signal that, when activated, maintains the control electrode and the release electrode at the same potential. The equilibration device may include a nanotube switching element or an MOS device.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention provide storage elements constructed using nanotube switching elements, and storage devices, including latches and master-slave latches, constructed therefrom. The elements and devices may be used as stand-alone components or cells integrated into other devices or used in any type of logic circuit or other circuit. In preferred embodiments, the master-slave latches have a master latch including an input buffer and a master storage cell, and a slave latch including an input buffer, a slave storage cell and an output driver. In preferred embodiments, the storage elements are non-volatile. In preferred embodiments, an equilibration device maintains the storage element inputs at the same potential when the storage device is in an off or store state, in order to protect the stored data from fluctuations. The storage elements and devices are preferably MOS, and particularly MOS, compatible, but may also be used in nanotube-switch only circuits. The storage elements and devices may also be fabricated in an integrated manner with MOS devices. The storage elements of preferred embodiments offer certain advantages over conventional MOS storage elements. The nanotube switching element-based storage elements dissipate power only when switching. They may also operate in harsh environments, such as at high temperature or high levels of radiation, in which MOS components may fail. The nanotube switching element-based storage elements also allow greater density of components in fabricated integrated circuits because nanotube layers may be constructed over conventional MOS layers.

Figure 1:
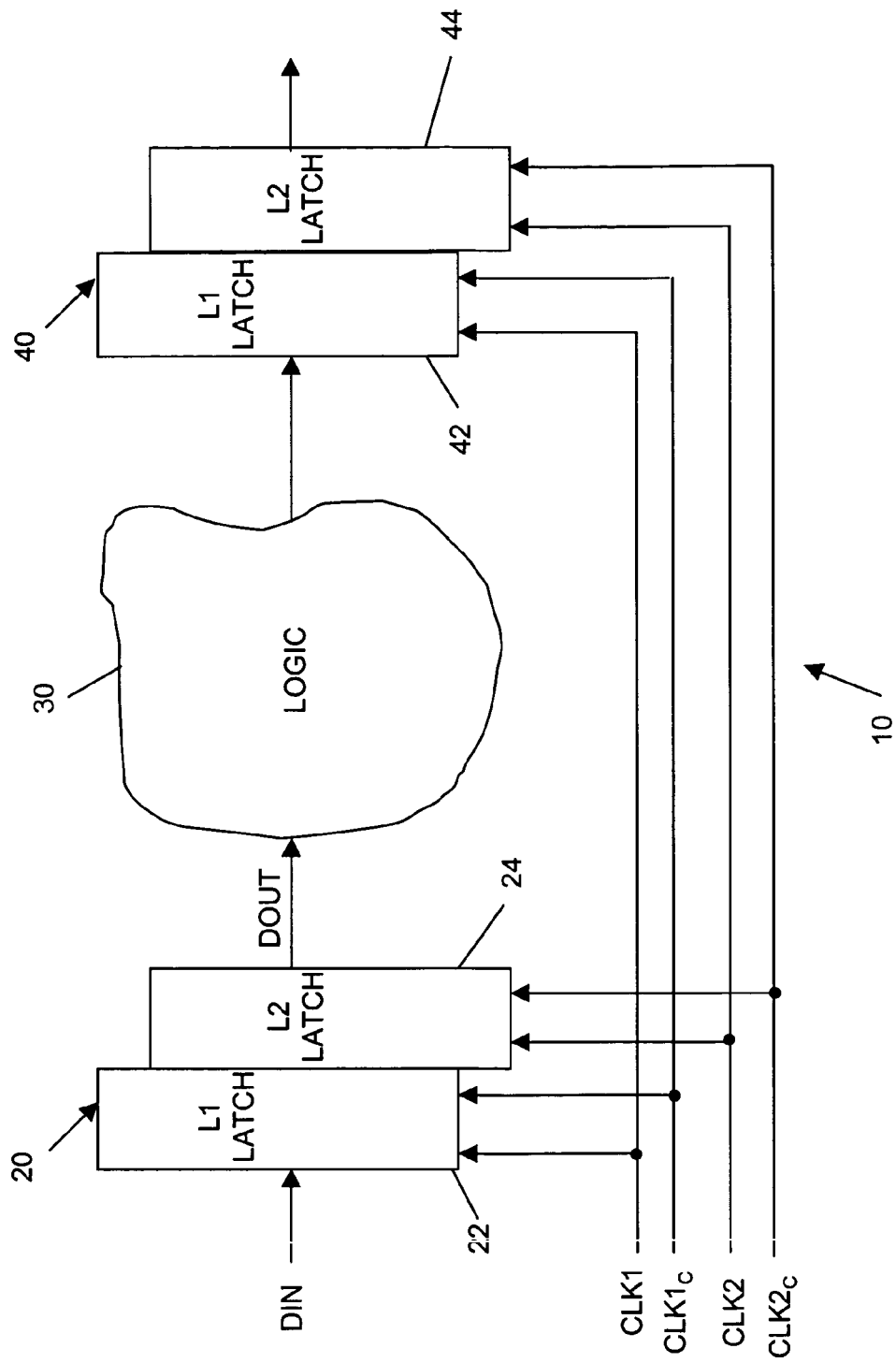
FIG. 1 is a schematic illustration of a prior art circuit including a master-slave storage device.

FIG. 1 illustrates a prior art digital logic circuit 10 including an input master-slave latch 20, combinational logic 30, and an output master-slave latch 40. The input master-slave latch 20 and the output master-slave latch 40 have the same architecture and operate in the same way. Each latch 20, 40 is a master-slave latch with a two-phase non-overlapping clock. Latch 20 has a input Din, a master latch 22, clocked by CLK1, a slave latch 24 clocked by CLK2, and an output Dout. CLK1 and CLK2 are non-overlapping. It will be appreciated that a reference to a clock signal herein also embraces its complement where appropriate; for example, where use of the complementary clock signal is necessary to provide a signal of the proper polarity to a switching element. The master latch 22 receives and temporarily stores data from a logic and/or memory circuit and provides it to the slave latch 24. The slave latch 24 receives the data from the master latch 22 and provides it to the next logic stage or other circuit component, a cache memory, for example. Master latch 22 is transparent to the input Din while CLK1 is low, captures the state of the input Din on the rising edge of CLK1, and continues to hold and provide as output the stored input Din while CLK1 is low. Slave latch 24 is transparent to the output of master latch 22 while CLK2 is low, captures the signal from master latch 22 on the rising edge of CLK2, and continues to hold and provide the signal as output Dout while CLK2 is low. Latch 40 also includes a master latch 42 and a slave latch 44. The master-slave latch architecture allows the output Dout to be isolated from changes in the input Din and limits changes in Dout to predictable clock transitions. Latches 20 and 40 are volatile, i.e., the stored data is lost if the power to the cell is interrupted. Circuit 10 is a sequential circuit, in which the present output depends on current inputs and previous states of the circuit.

Figure 2:
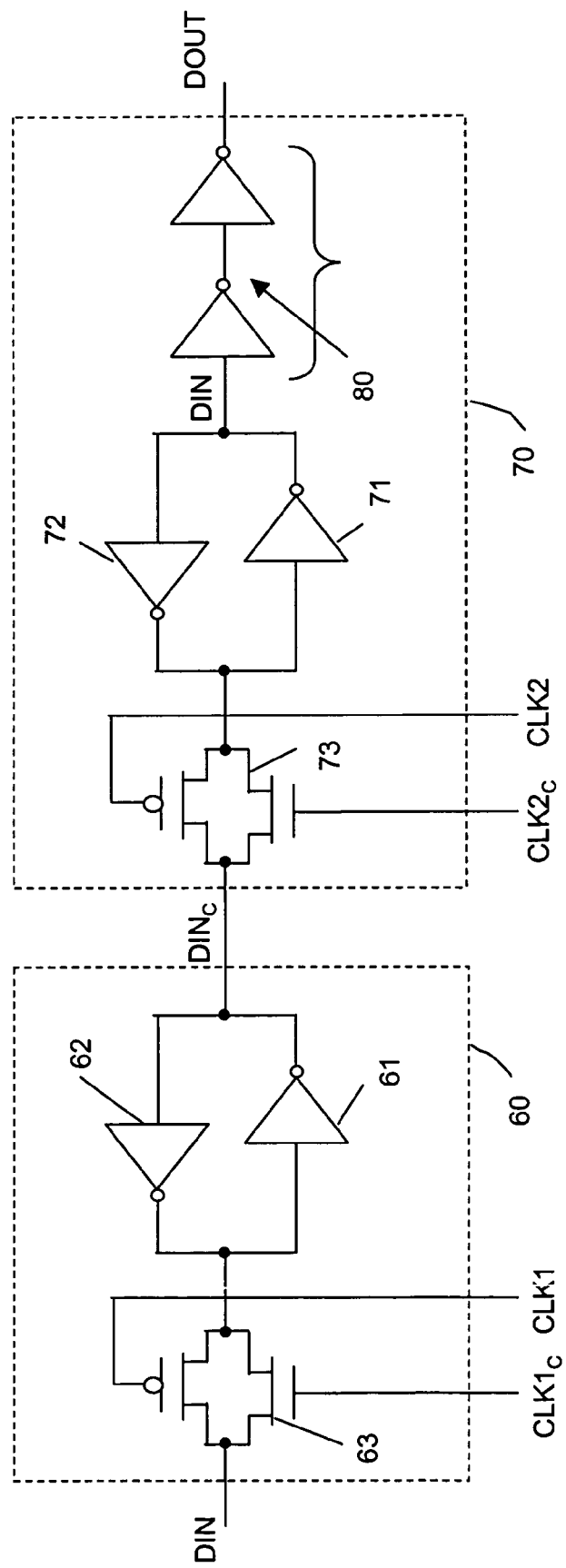
FIG. 2 is a schematic illustration of a prior art master-slave storage device.

FIG. 2 illustrates a prior art CMOS implementation of a master-slave latch 50. Latch 200 operates as described above with respect to latches 20 and 40. Latch 50 includes a master latch 60 and a slave latch 70. The master latch 60 includes a storage cell formed of two inverters 61 and 62 connected in a feedback loop. Master latch 60 also includes a transfer device pair 63 for gating Din under the control of clock signal CLK1. Slave latch 70 also includes a storage cell formed of two inverters 71 and 72 connected in a feedback loop. Slave latch 70 includes a transfer device pair 73 for gating Dins under the control of clock signal CLK1. Slave latch also incorporates an output driver 80 including two inverters connected in sequence to drive output Dout.

FIGS. 5-13 illustrate various storage elements constructed using nanotube switching elements, and related circuitry, according to certain aspects of the invention. FIGS. 3A-D depict an exemplary nanotube switching element 300 in cross-section and layout views and in two informational states for use in certain embodiments of the invention. A more detailed description of these switches and other architectures for nanotube switching elements may be found in the related cases identified and incorporated above. Non-volatile four-terminal nanotube switching elements are described in U.S. patent application Ser. No. 10/918,085, which is incorporated by reference above. A brief description follows here for convenience.

Figure 3A:
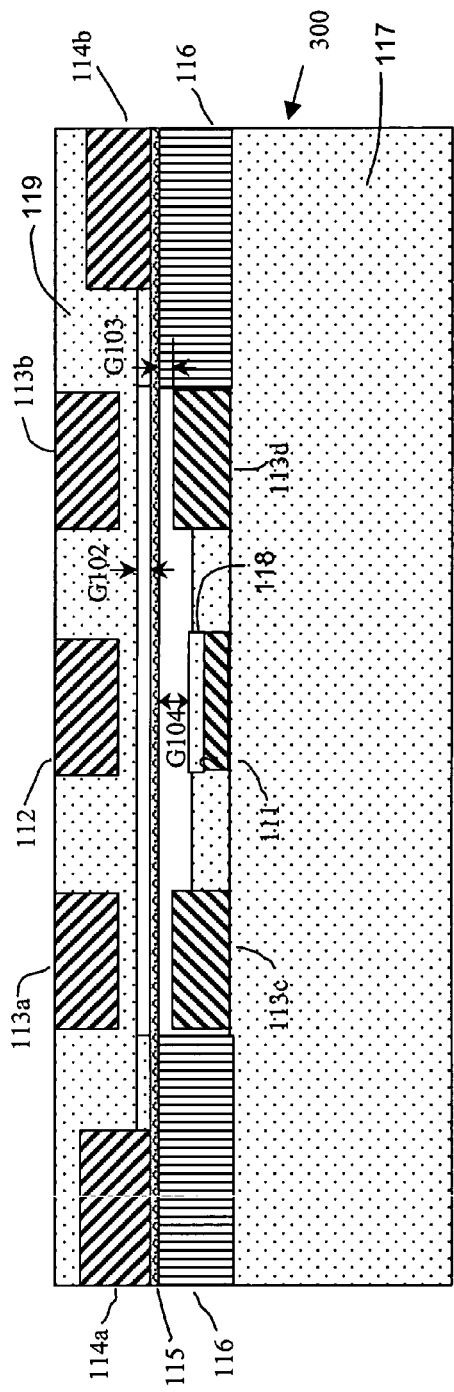
FIGS. 3A-D are illustrations of an exemplary nanotube switching element used in certain embodiments of the invention.

FIG. 3A is a cross sectional view of a preferred nanotube switching element 100. Nanotube switching element includes a lower portion having an insulating layer 117, control electrode 111, and output electrodes 113c,d. Nanotube switching element further includes an upper portion having release electrode 112, output electrodes 113a,b, and signal electrodes 114a,b. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Output electrodes 113a,b are made of conductive material and are separated from nanotube channel element 115 by insulating material 119.

Output electrodes 113c,d are likewise made of conductive material and are separated from nanotube channel element 115 by a gap height G103. Notice that the output electrodes 113c,d are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114a,b each contact the nanotube channel element 115 and can therefore supply whatever signal is on the signal electrode to the channel element 115. This signal may be a fixed reference signal (e.g., $V_{DD}$ or Ground) or varying (e.g., a Boolean discrete value signal that can change). Only one of the electrodes 114a,b need be connected, but both may be used to reduce effective resistance.

Nanotube channel element 115 is a lithographically-defined article made from a porous fabric of nanotubes (more below). It is electrically connected to signal electrodes 114a, b. The electrodes 114a,b and support 116 pinch or hold the channel element 115 at either end, and it is suspended in the middle in spaced relation to the output electrodes 113a-d and the control electrode 111 and release electrode 112. The spaced relationship is defined by the gap heights G102-G104 identified above. For certain embodiments, the length of the suspended portion of channel element 115 is about 300 to 350 nm.

Under certain embodiments the gaps G103, G104, G102 are in the range of 5-50 nm. The dielectric on terminals 112, 111, and 113a and 113b are in the range of 5-30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

Figure 3B:
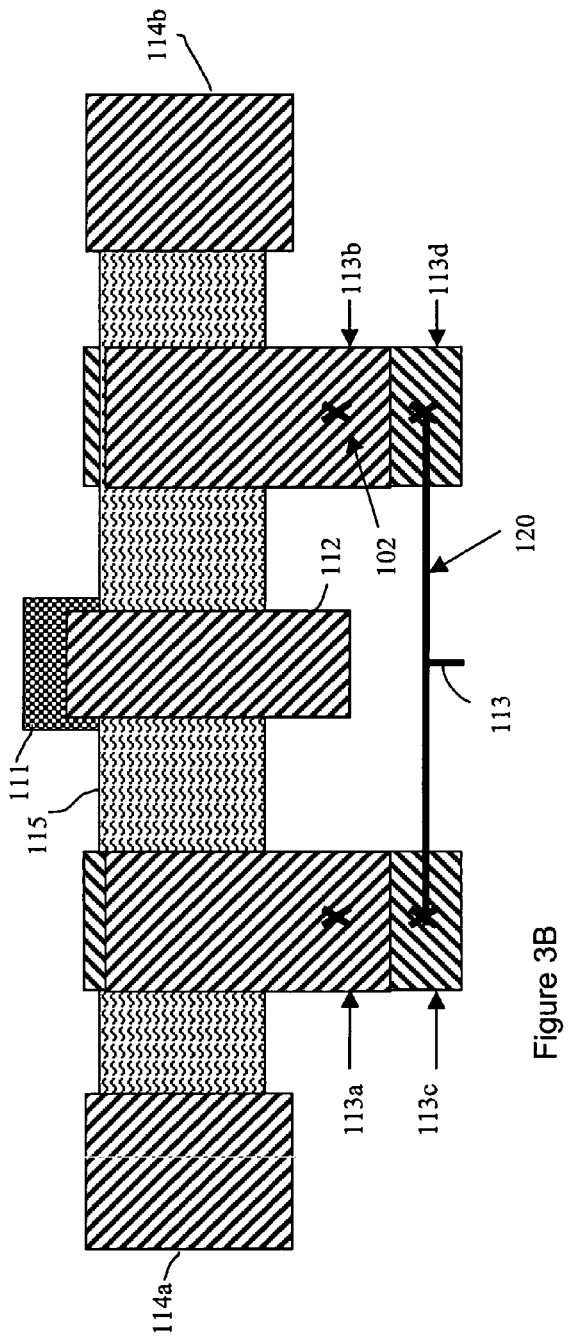

FIG. 3B is a plan view or layout of nanotube switching element 100. As shown in this figure, electrodes 113b,d are electrically connected as depicted by the notation 'X' and item 102. Likewise electrodes 113a,c are connected as depicted by the 'X'. In preferred embodiments the electrodes are further connected by connection 120. All of the output electrodes collectively form an output node 113 of the switching element 100.

Figure 3C:
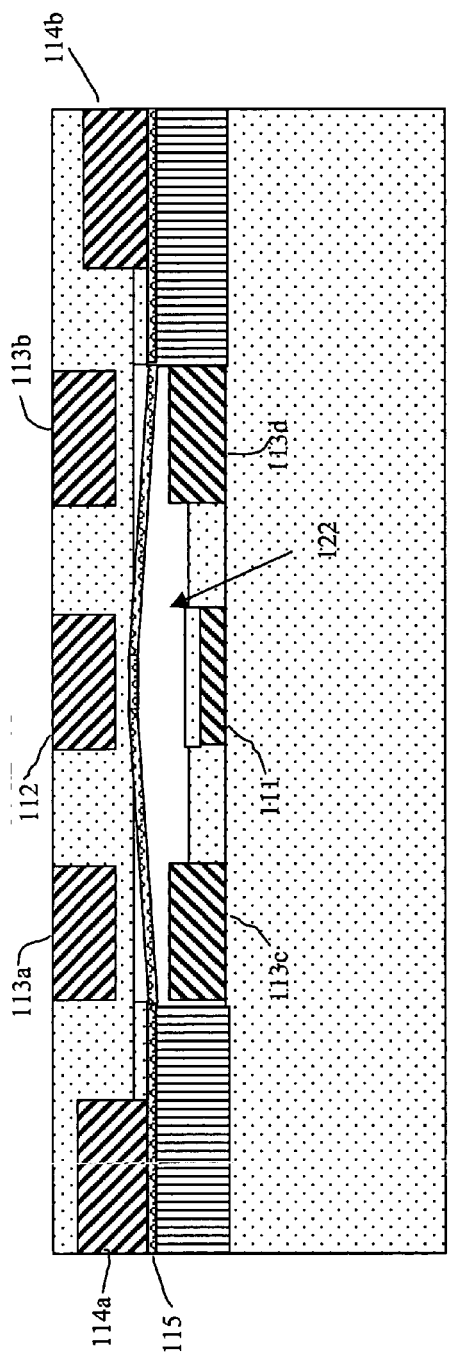
Figure 3D:
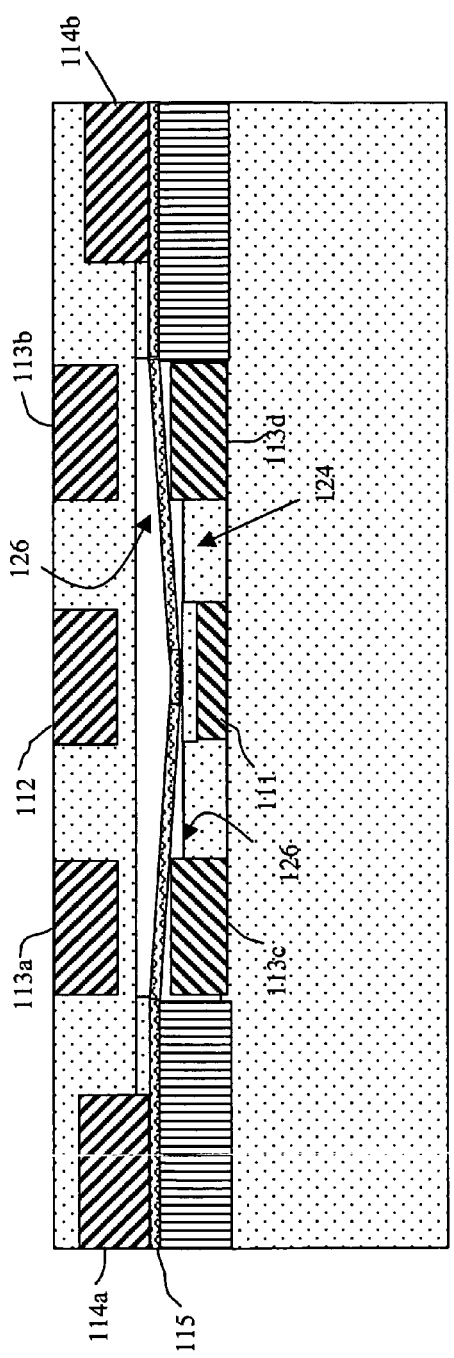

Under preferred embodiments, the nanotube switching element 100 of FIGS. 3A and 3B operates as shown in FIGS. 3C and D. Specifically, nanotube switching element 100 is in an OPEN (OFF) state when nanotube channel element is in position 122 of FIG. 3C. In such state, the channel element 115 is drawn into mechanical contact with dielectric layer 119 via electrostatic forces created by the potential difference between electrode 112 and channel element 115. Output electrodes 113a,b are in mechanical contact (but not electrical contact) with channel element 115. Nanotube switching element 100 is in a CLOSED (ON) state when channel element 115 is elongated to position 124 as illustrated in FIG. 3D. In such state, the channel element 115 is drawn into mechanical contact with dielectric layer 118 via electrostatic forces created by the potential difference between electrode 111 and channel element 115. Output electrodes 113c,d are in mechanical contact and electrical contact with channel element 115 at regions 126. Consequently, when channel element 115 is in position 124, signal electrodes 114a and 114b are electrically connected with output terminals 113c,d via channel element 115, and the signal on electrodes 114a,b may be transferred via the channel (including channel element 115) to the output electrodes 113c,d.

By properly tailoring the geometry of nanotube switching element 100, the nanotube switching element 100 may be made to behave as a non-volatile or a volatile switching element. By way of example, the device state of FIG. 3D may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

The nanotube switching element 100 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with dielectric 118 on electrode 111 (or dielectric 119 on electrode 112). (This aspect of operation is described more fully in the incorporated patent references.) This deflection is depicted in FIGS. 3D (and 3C). The attractive force elongates (stretches) and deflects the nanotube fabric of channel element 115 until it contacts the insulated region 118 of the electrode 111. The nanotube channel element is thereby strained, and there is a restoring tensil force, dependent on the geometrical relationship of the circuit, among other things.

By using appropriate geometries of components, the switching element 100 then attains the closed, conductive state of FIG. 3D in which the nanotube channel 115 mechanically contacts the control electrode 111 and also output electrode 113c,d. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113. Instead, the channel element 115 is attracted to and physically contacts the insulation layer on release electrode 112. This OPEN (OFF) state is shown in FIG. 3C. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 3A) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 3A. Instead, the electrodes 111 and 112 are expected to be operated so that the channel element 115 will either be in the state of FIG. 3C or 3D.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, a floating output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 115 is disposed between two oppositely disposed electrodes 113b,d (and also 113a,c) of equal potential. Consequently, there are opposing electrostatic forces that result from the voltage on the output node. Because of the opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

Under certain embodiments of the invention, the nanotube switching element 100 of FIG. 3A may be used as pull-up and pull-down devices to form power-efficient circuits. Unlike MOS and other forms of circuits, the pull-up and pull down devices may be identical devices and need not have different sizes or materials. To facilitate the description of such circuits and to avoid the complexity of the layout and physical diagrams of FIGS. 3A-D, a schematic representation has been developed to depict the switching elements.

In summary, a four-terminal nanotube switching element includes a nanotube channel element that provides a controllably formable conductive channel from an input terminal to an output terminal. A control input provided via a control terminal controls the formation of the conductive channel. A release input, which is complementary to the control input in preferred embodiments, provided via a release terminal resets the nanotube channel element from an ON state to an OFF state. In some applications, during a portion of the operating cycle, it may be desirable to set control input and release input to the same voltage. If control input and release input are at the same voltage, the device maintains its state, independent of the input and release voltage values and the output voltage values.

Figure 4C:
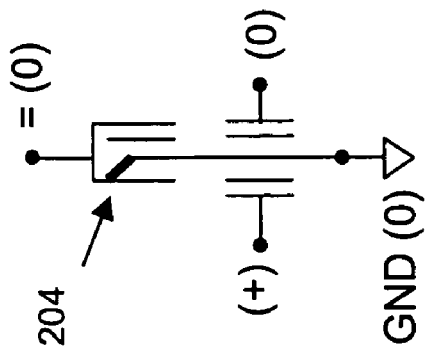
FIGS. 4A-C are schematic representations of a nanotube switching element in various states of operation according to an embodiment of the invention.
Figure 4B:
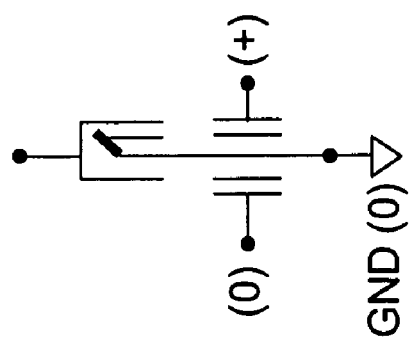
Figure 4A:
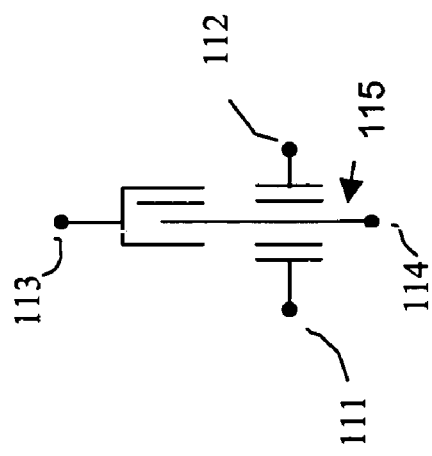

FIG. 4A is a schematic representation of a nanotube switching element 100 of FIG. 3A. The nodes use the same reference numerals. This type of schematic representation is used to indicate a nanotube switching element throughout the present application for convenient reference.

FIGS. 4B-C depict a nanotube channel element 100 when its signal electrode is tied to VDD, and its states of operation. For example, FIG. 4B is a schematic representation of the nanotube switching element in the OPEN (OFF) state illustrated in FIG. 3C, in which signal node 114 and the nanotube channel element 115 are at ground, the control electrode 111 is at ground, and the release electrode 112 is at VDD. The nanotube channel element is not in electrical contact with output node 113. FIG. 4C is a schematic representation of the nanotube switching element in the CLOSED (ON) state illustrated in FIG. 3D. In this case, signal node 114 and the nanotube channel element 115 are at ground, the control electrode 111 is at $V_{DD}$, and the release electrode 112 is at ground. The nanotube channel element is deflected into mechanical and electrical contact with the output node 113. Moreover, if as described above, geometries are selected appropriately, the contact will be non-volatile as a result of the Van der Waals forces between the channel element and the uninsulated, output electrode. The state of electrical contact is depicted by the short black line 204 representing the nanotube channel element contacting the output terminal 113. This results in the output node 113 assuming the same signal (i.e., ground or 0 V) as the nanotube channel element 115 and signal node 114.

Figure 5A:
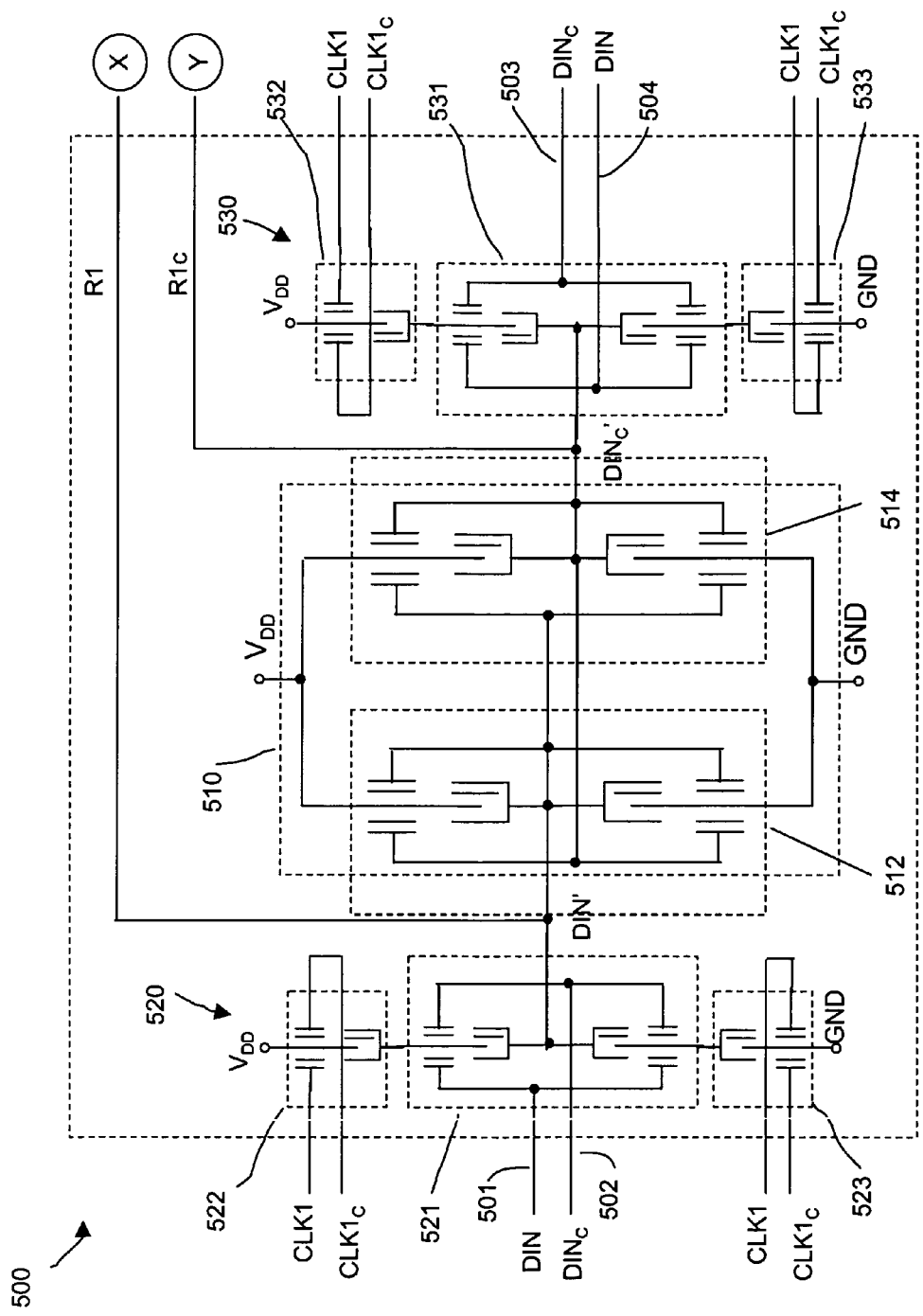
FIGS. 5A-B are a schematic illustration of an exemplary latch constructed from nanotube switching elements according to an embodiment of the invention.
Figure 5B:
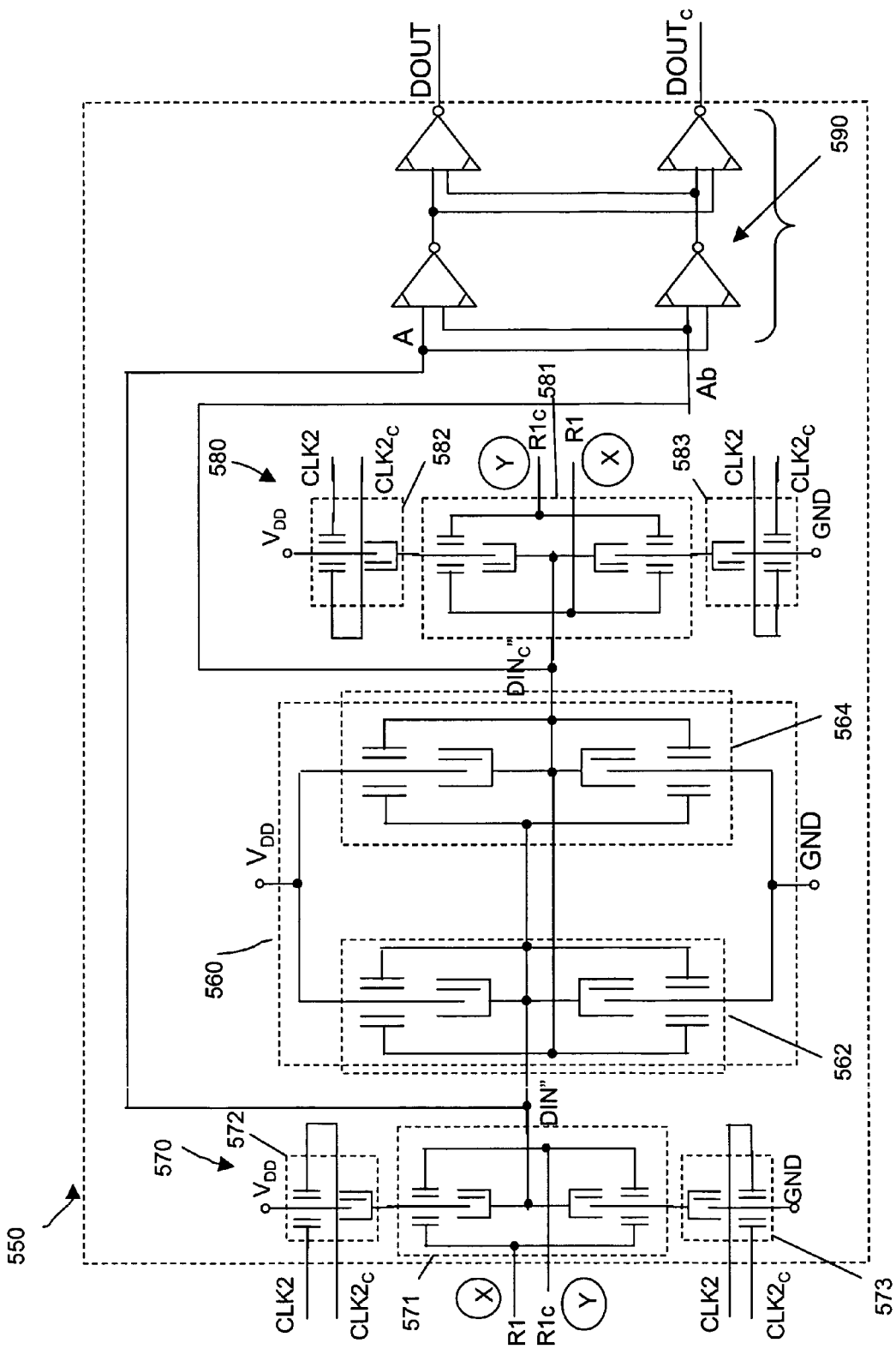

FIGS. 5A and 5B illustrate one embodiment of a master-slave latch constructed in accordance with aspects of the present invention. The latch of FIGS. 5A and 5B is constructed entirely of nanotube-based switching elements and does not include any conventional CMOS transistors. The latch of FIGS. 5A and 5B is a dual-rail differential input and dual-rail differential output device. FIG. 5A illustrates the master latch 500 and FIG. 5B illustrates the slave latch 550 of the master-slave latch. Master latch 500 has two complementary inputs, Din and $Din_C$. (The subscript "C" is used to denote a complementary signal.) Master latch 500 also has two complementary outputs R1 and $R1_C$. X and Y are used to indicate interconnection points between the schematic of FIG. 5A and the schematic of FIG. 5B. Master latch 500 includes a storage element 510 and a tri-state input buffer provided by a first tri-state inverter 520 and a second tri-state inverter 530.

The tri-state input buffer forms a dual-rail differential input stage for the master-slave latch clocked by CLK1. Master latch 500 has 2 input terminals 501 and 502. Tri-state inverters 520 and 530 provide complementary inputs Din and $Din_C$ to the master latch 500 under the control of clock signal CLK1. Tri-state inverters 520 and 530 have the same architecture. Tri-state inverter 520 is a nanotube switching element-based dual rail differential input, single rail output, tristate inverter. Tri-state inverter 520 is formed of four-terminal nanotube switching elements, of the type illustrated in FIGS. 3A-3D.

Tri-state inverter 520 includes an inverter 521 and tri-stating switching elements 522 and 523. Inverter 521 includes a pull-up switching element, which provides a path from $V_{DD}$ to the output under the control of an input signal when tri-state element 522 is activated, and a pull-down switching element, which provides a path from GND to the output under the control of an input signal when tri-state element 523 is activated. The control electrodes of the pull-up and pull-down switching elements are tied to a single input terminal and are connected to Din. The release electrodes of the pull-up and pull-down switching elements are tied to a single input terminal and are connected to $Din_C$. Inverter 521 functions to invert Din; the operation of inverter 521 is tri-stated under the control of CLK1. Tri-stating switching elements 522 and 523 are four-terminal nanotube switching elements. Tri-stating switching element 522 is disposed between VDD and the signal electrode of the pull-up switching element of inverter 521, where the signal electrode corresponds to signal electrode 114 of nanotube switching element 300 illustrated in FIGS. 3A-3D. The signal electrode of tri-state switching element 522 is connected to VDD and the output electrode is connected to the signal electrode of the pull-up switching element of inverter 521. The control electrode of tri-stating switching element 522 is connected to CLK1, while the release electrode is connected to the complement, $CLK1_C$. Tri-stating switching element 523 is disposed between GND and the signal electrode of the pull-down switching element of inverter 521. The input electrode of tri-state switching element 523 is connected to GND and the output electrode is connected to the signal electrode of the pull-down switching element of inverter 521. The control electrode of tri-stating switching element 523 is connected to $CLK1_C$, while the release electrode is connected to CLK1. CLK1 and $CLK1_C$ enable and disable the tri-stating inverters 520 and 530. When CLK1 is high, the output of inverter 520 is tri-stated because tri-stating switches 522 and 523 are OFF. Accordingly, tri-state switching elements 522 and 523 are activated only when CLK1 is low. When CLK1 is low, inverter 520 inverts the input Din to produce the output Din', which is equivalent to $Din_C$.

Tri-state inverter 530 operates in a similar way to tri-state inverter 520. Tri-state switching elements 532 and 533 are equivalent to tri-stating switching element 522 and 523, respectively. Also, inverter 531 is equivalent to inverter 521. The input to inverter 530 however is $Din_C$ and the inverted output is $Din_C'$, which is equivalent to Din.

Storage element 510 is formed of cross-coupled nanotube switching element-based inverters 512 and 514. Inverter 514 and inverter 512 have the same architecture. Both use non-volatile four-terminal nanotube switching elements as a basic building block. Inverters 512 and 514 are similar to inverter 521. Inverter 512 has an input, a release input (the complement of the input) and an output. Inverter 512 is formed of a pull-up circuit including a non-volatile four-terminal nanotube switching element connected to VDD and a pull-down circuit including a non-volatile four-terminal nanotube switching element connected to ground. The control electrodes of the pull-up nanotube switching and the pull-down element are tied to the inverter input. Similarly, the release electrodes of the pull-down nanotube switching element and the pull-up nanotube switching element are tied to the release input. The input of inverter 512 is connected to $Din_C'$ (equivalent to Din) and the release input of inverter 512 is connected to Din'. The input of inverter 514 is connected to Din' and the release input of inverter 514 is connected to $Din_C'$. The inverters 512 and 514 are cross-coupled such that the output of each inverter is also connected to the input of the other inverter. As discussed further below, because inverters 512 and 514 are non-volatile devices, storage element 510 is a non-volatile storage element.

In operation, when CLK1 is low, storage element 510 has active inputs and stores the output of tri-stating inverter 520 and complementary tri-stating inverter 530. If Din is 1, then Din' is 0 and "1" is stored in inverter 512; if Din is 0, then Din' is 1 and "0" is stored in inverter 512. Inverter 514 stores the complementary logic level. When CLK1 goes high, the input signals to storage element 510 are effectively disconnected by the tri-stating inverters 520 and 530. Thus, storage element 510 stores the values present on its inputs at the rising edge of CLK1. These stored values will not change while CLK1 is high or if power to the circuit is interrupted. Since inverters 512 and 514 are non-volatile, the values present on the rising edge of CLK1 can be stored indefinitely.

Storage element 510 provides outputs R1 (which corresponds to Din', equivalent to $Din_C$) and $R1_C$ (which corresponds to $Din_C'$, equivalent to Din) to slave latch 550.

The architecture of slave latch 550 is similar to that of master latch 500. Slave latch 550 includes an input buffer comprising a first tri-stating inverter 570 and a second tri-stating inverter 580 controlled by CLK2. Slave latch 550 also includes a storage element 560. Tri-stating inverter 570 includes an inverter 571 and a pull-up tri-stating switching element 572 and a pull-down tri-stating switching element 573. Tri-stating inverter 580 includes an inverter 581 and a pull-up tri-stating switching element 582 and a pull-down tri-stating switching element 583. The tri-stating switching elements 572 and 573, 582 and 583 are connected to CLK2 and CLK2'. The tri-stating inverters 570 and 580 are activated when CLK2 is low. Thus, tri-stating inverters 570 and 580 provide signals R1' and $R1_C'$ to storage element 560 when CLK2 is low and are tri-stated when CLK2 is high. Storage element 560 also comprises cross-coupled nanotube-based inverters 562 and 564. Storage element 560 stores R1' and $R1_C'$ on the rising edge of CLK2. Slave latch 550 also includes output drivers 590 formed from dual-rail differential input and dual-rail differential output inverters. In preferred embodiments, output drivers 590 are also implemented using nanotube-based devices (indicated by the notations on the corners of the conventional inverter symbol). The output drivers 590 are preferably capable of driving CMOS-based devices, nanotube-based devices, or both. The outputs Dout and $Dout_C$ become valid on propagation delay after CLK2 goes low.

CLK1 and CLK2 are preferably implemented as non-overlapping clock signals. Thus, the device composed of master latch 500 and slave latch 550 is a master-slave latch with a two-phase non-overlapping clock, formed of nanotube switching elements.

Various embodiments of the invention like the nanotube-based master-slave latch illustrated in FIGS. 5A and 5B offers certain advantages over conventional CMOS devices. The master-slave latch is preferably CMOS compatible, but may also be used in nanotube-switch only circuits. The master-slave latch may also be fabricated in an integrated manner with CMOS devices. The nanotube switching element-based storage elements dissipate power only when switching. They may also operate in harsh environments, such as at high temperature or high levels of radiation, in which CMOS components may fail. The nanotube switching element based storage elements also allow greater density of components in fabricated integrated circuits because nanotube layers may be constructed over conventional CMOS layers. Greater density permits fabrication of smaller integrated circuits or more logic on a chip of a given size.

The latch architecture of storage elements 510 and 560 may also be used separately as a basic storage element or as a building block for other devices. This storage element offers the advantages of nanotube-based devices.

Figure 6:
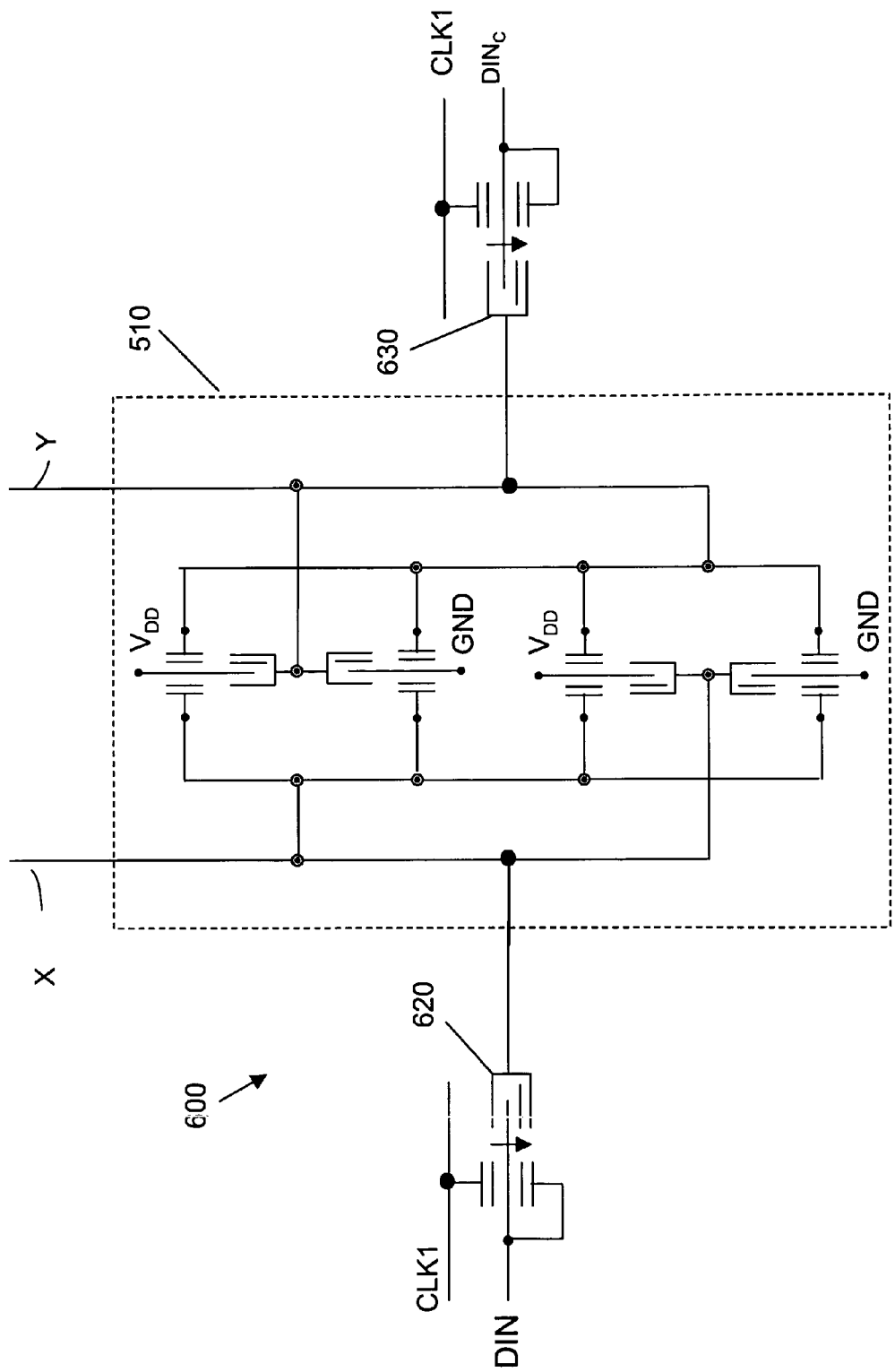
FIG. 6 is a schematic illustration of an exemplary master latch constructed from nanotube switching elements according to an embodiment of the invention.

FIG. 6 is a schematic representation of a gated latch 600 that provides an alternate embodiment for master latch 500. In gated latch 600, a volatile three-terminal single-rail input nanotube-based transfer device 620, 630 is used in place of each tri-state inverter 520, 530 in master latch 500. In the illustrated embodiment, each volatile three-terminal single-rail input device 620 and 630 is constructed from a four-terminal nanotube switching element wherein the release electrode is connected to the signal electrode. Each volatile three-terminal single-rail input nanotube-based transfer device 620 and 630 has an input, Din and $Din_C$, respectively, and an output to storage element 510. The transfer of the input from the signal electrode of each transfer device to the output electrode is controlled by CLK1. When CLK1 is high, transfer device 620 transfers the signal Din. The conductive channel is created by the deflection of the nanotube channel element when there is a sufficient potential difference (regardless of polarity) between the nanotube channel element and a control electrode. Since the potential of the signal Din is variable between a digital 0 and a digital 1, and may be in the range of, e.g., 0V to $V_{DD}$, if the control signal provided to transfer device 620 also has the same operating range, i.e., 0 V to $V_{DD}$, the transfer device will not switch ON and OFF as desired. In some cases, the potential difference may not exceed the threshold amount, e.g., when the input signal is a digital 1, to form the channel and transfer the signal. In other cases, the potential difference may exceed the threshold amount, forming the channel, when channel formation is not desired, e.g., when the input signal is a digital 1 and the clock signal is a digital 0. Accordingly, CLK1 is shifted to an operating range wherein proper switching operation can be expected, e.g, the transfer device is OFF (not conducting) when CLK1 is low and is ON (conducting) when CLK1 is high. CLK1 may be overdriven to a potential greater than an upper supply voltage. The desired operating range of CLK1 depends on the architecture and dimensions of the nanotube transfer device. Conventional signal step-up circuitry can be used to shift CLK1 to the desired operating range. U.S. patent application Ser. No. 11/033,087, filed on Jan. 10, 2005, entitled Nanotube-Based Transfer Devices and Related Circuits, having the same assignee as the present application, describes certain circuits incorporating this signal shifting technique and is incorporated herein by reference. This embodiment 600 is advantageous in that a smaller number of components are used to implement the gating function than in master latch 500. Volatile three-terminal single-rail input nanotube-based transfer devices may also be used to replace tri-state inverters 570 and 580 in slave latch 550.

Figure 7:
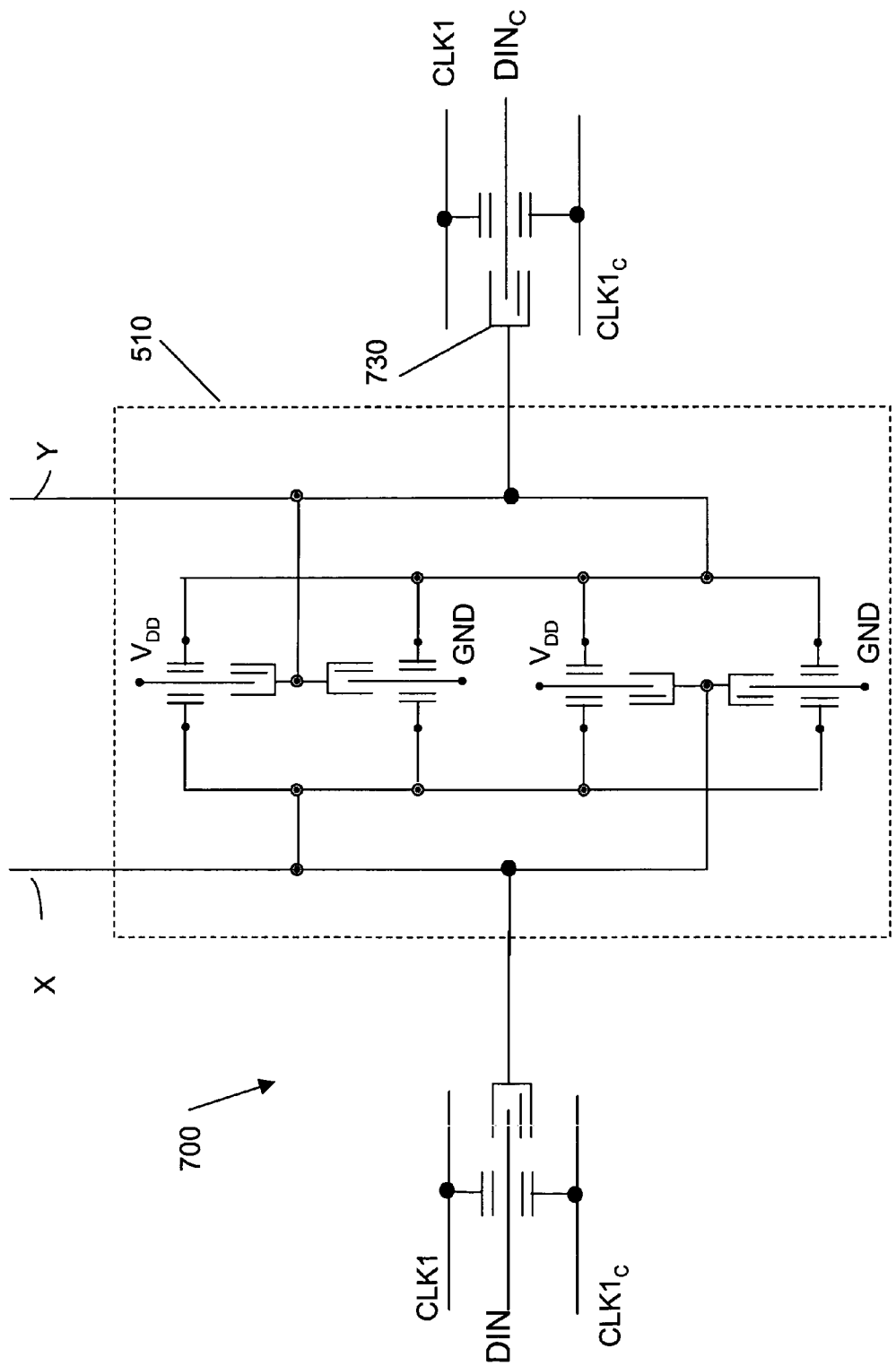
FIG. 7 is a schematic illustration of an exemplary master latch constructed from nanotube switching elements according to an embodiment of the invention.

FIG. 7 is a schematic representation of a gated latch 700 that provides another alternative embodiment for master latch 500. Gated latch 700 uses a non-volatile four-terminal dual-rail input nanotube-based transfer device 720, 730 in place of each tri-state inverter 520, 530 in master latch 500. The operating range of CLK1 and $CLK1_C$ control signals provided to transfer devices 720 and 730 should also be shifted, as described above with respect to latch 600, in order to ensure proper operation of the transfer devices.

Figure 8:
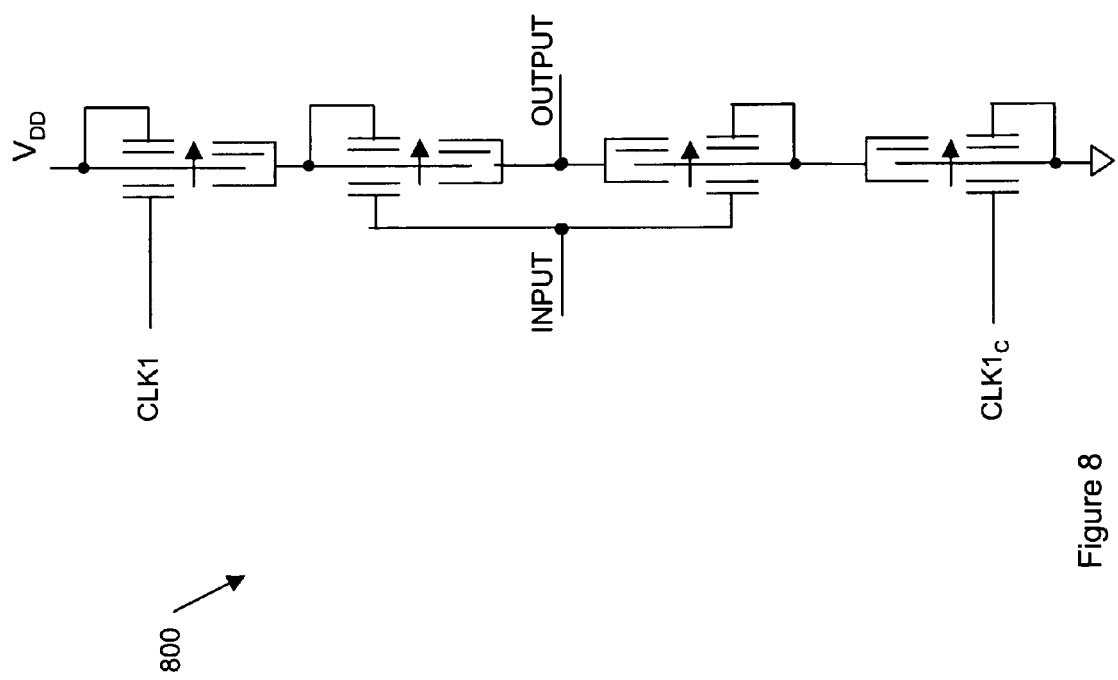
FIG. 8 is a schematic illustration of an exemplary input buffer constructed from nanotube switching elements according to an embodiment of the invention.

FIG. 8 is a schematic representation of a volatile single-rail tristate inverter 800 that can be used to replace each of non-volatile tristate inverters 520 and 530 in master latch 500. The four-terminal non-volatile nanotube switching elements of tristate inverters 520 and 530 are replaced with three-terminal volatile nanotube switching elements in volatile single-rail tristate inverter 800. In the illustrated embodiment 800, each volatile three-terminal single-rail input device is constructed from a four-terminal nanotube switching element wherein the release electrode is connected to the signal electrode.

Figure 9A:
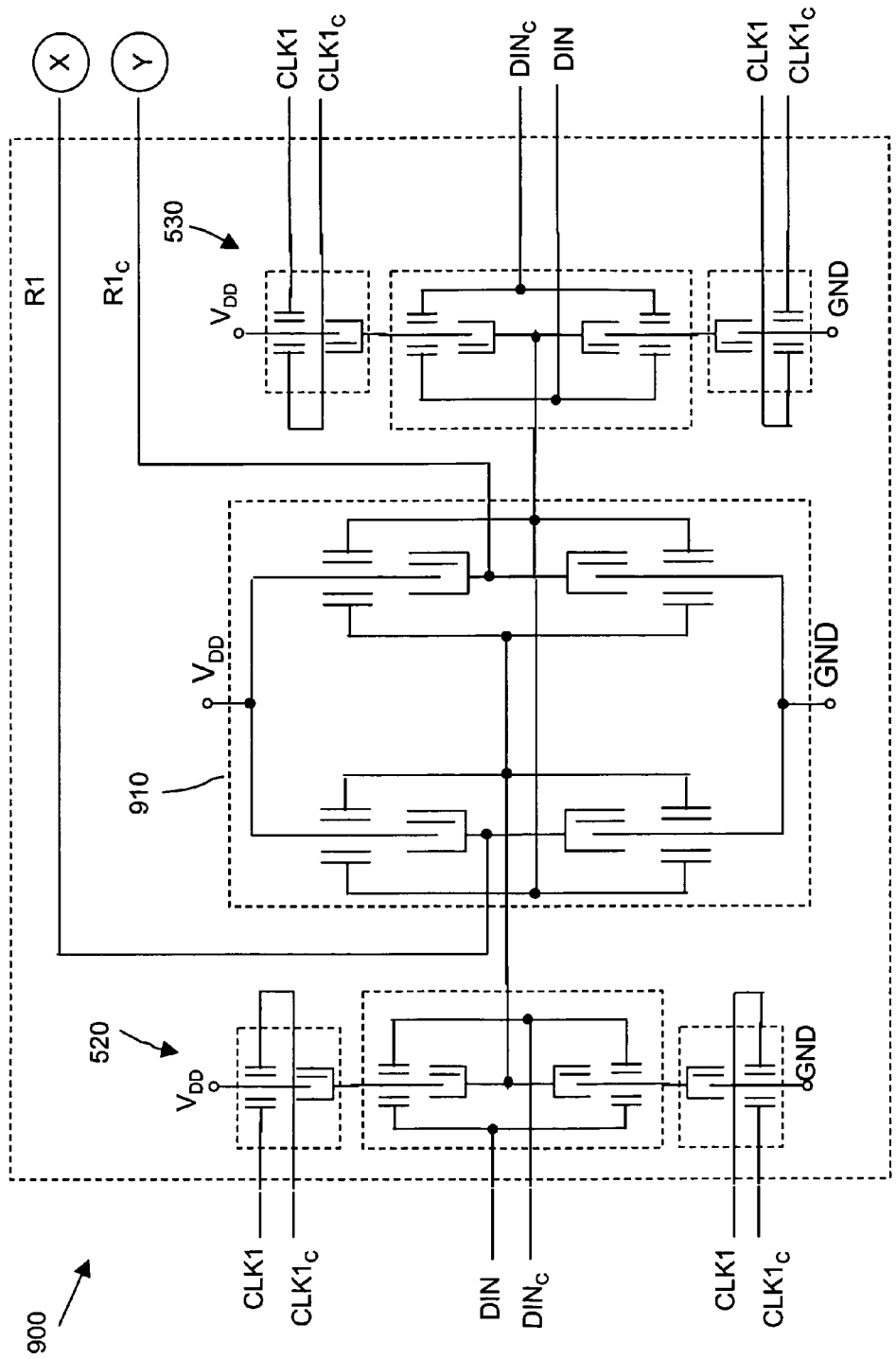
FIGS. 9A-B are a schematic illustration of an exemplary latch constructed from nanotube switching elements according to an embodiment of the invention.
Figure 9B:
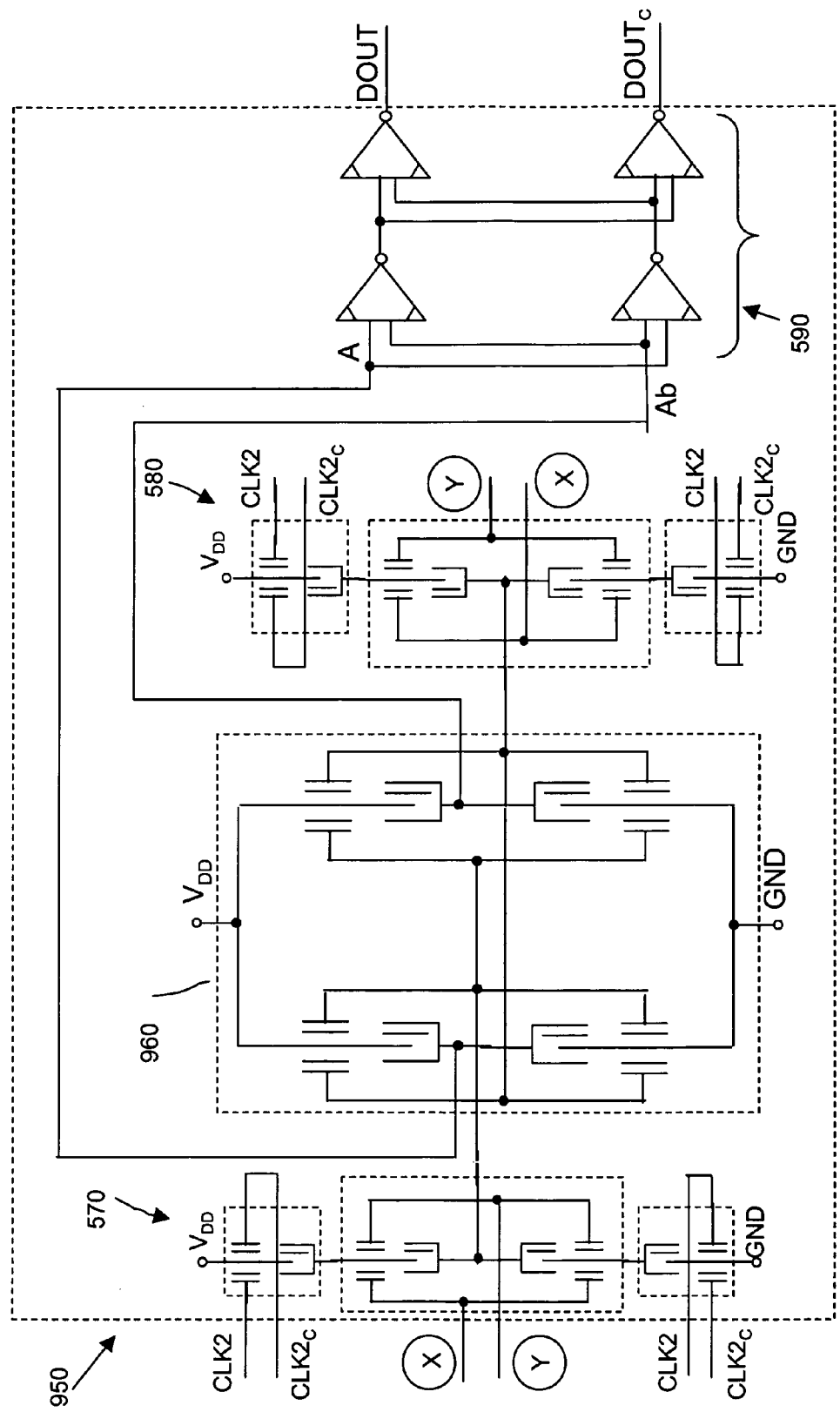

FIGS. 9A and 9B illustrate a master-slave latch constructed in accordance with another aspect of the invention. Master latch 900 and slave latch 950 incorporate latches 910 and 960 formed of non-volatile nanotube-based inverters that are not cross-coupled. Cross-coupling is not necessary because the non-volatile elements are able to store a data bit, unlike a volatile CMOS element.

Figure 10A:
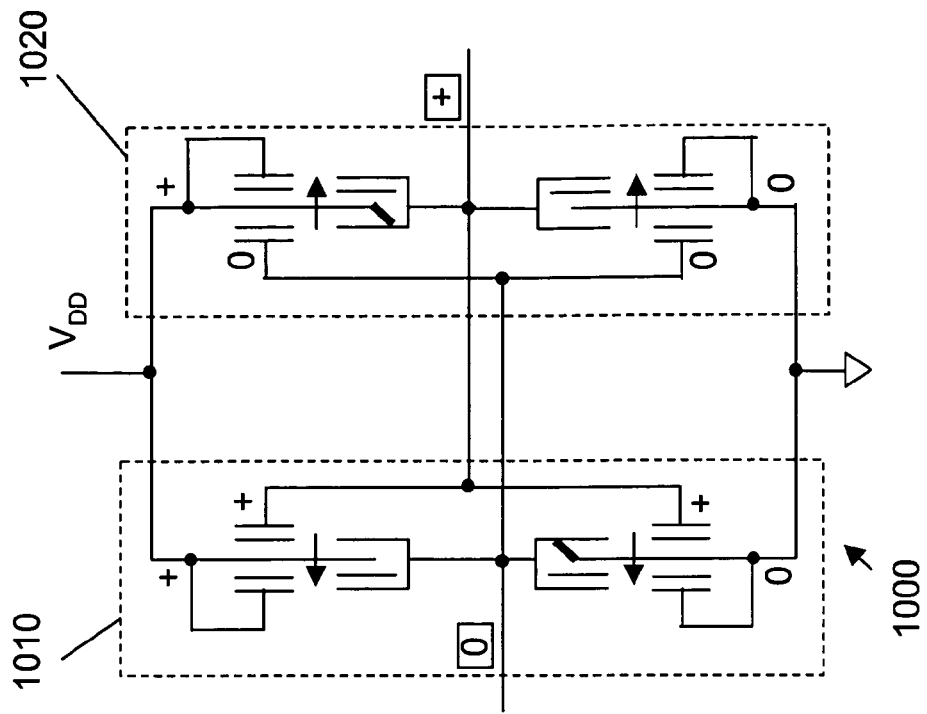
FIGS. 10A-B are schematic illustrations of an exemplary volatile storage element constructed from nanotube switching elements according to an embodiment of the invention.
Figure 10B:
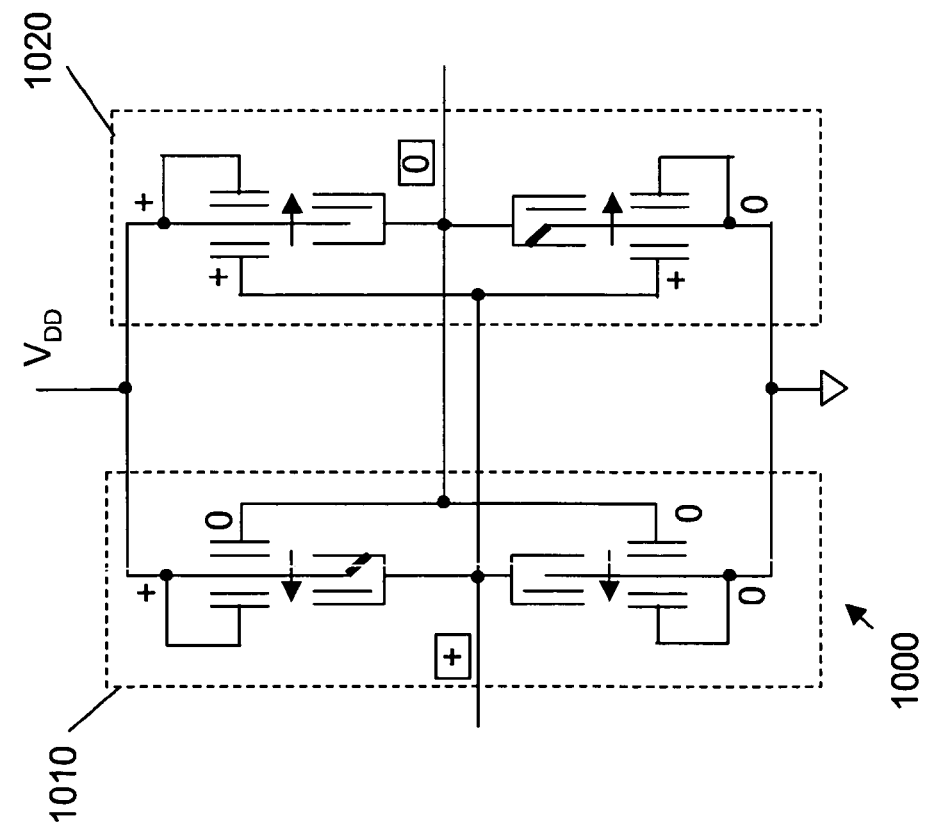

FIGS. 10A and 10B illustrate the implementation and operation of a volatile latch 1000 that can be used in place of each of latches 510 and 560. Volatile latch 1000 is composed of two inverters 1010 and 1020 formed from four-terminal nanotube switching elements wherein the release electrode is connected to the input electrode to form a three-terminal device. The nanotube switching elements are volatile. The inverters 1010 and 1020 are also volatile. The inverters are cross-coupled. FIG. 10A illustrates storage of a 1 in the left inverter 1000 (from a 0 value input signal), and its complement in the right inverter 1020. FIG. 10B illustrates storage of a 0 in the left inverter 1010 (from a positive value input signal) and its complement in the right inverter 1020.

Figure 11A:
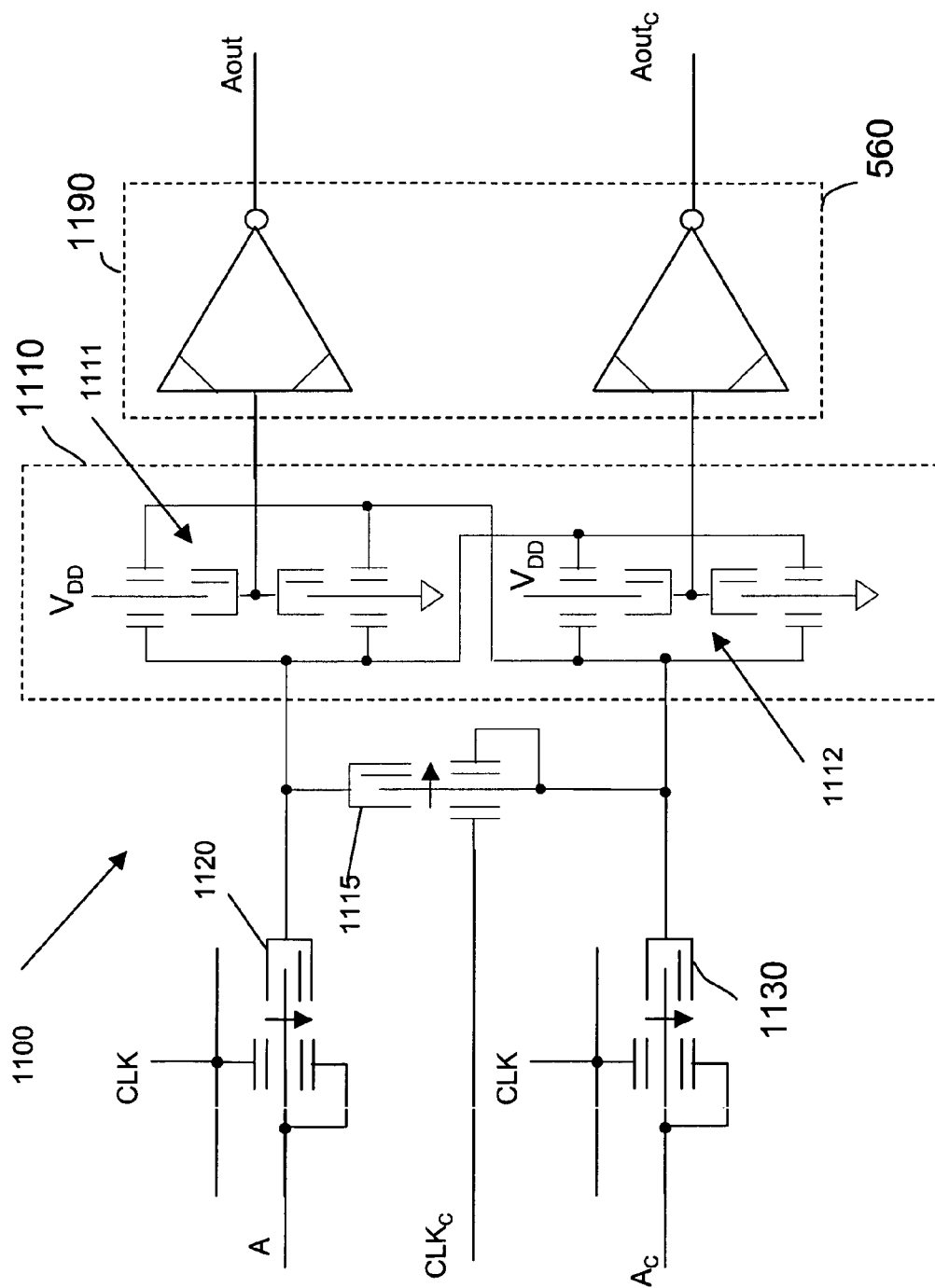
FIGS. 11A-C are schematic illustrations of an exemplary storage device according to an embodiment of the invention.
Figure 11B:
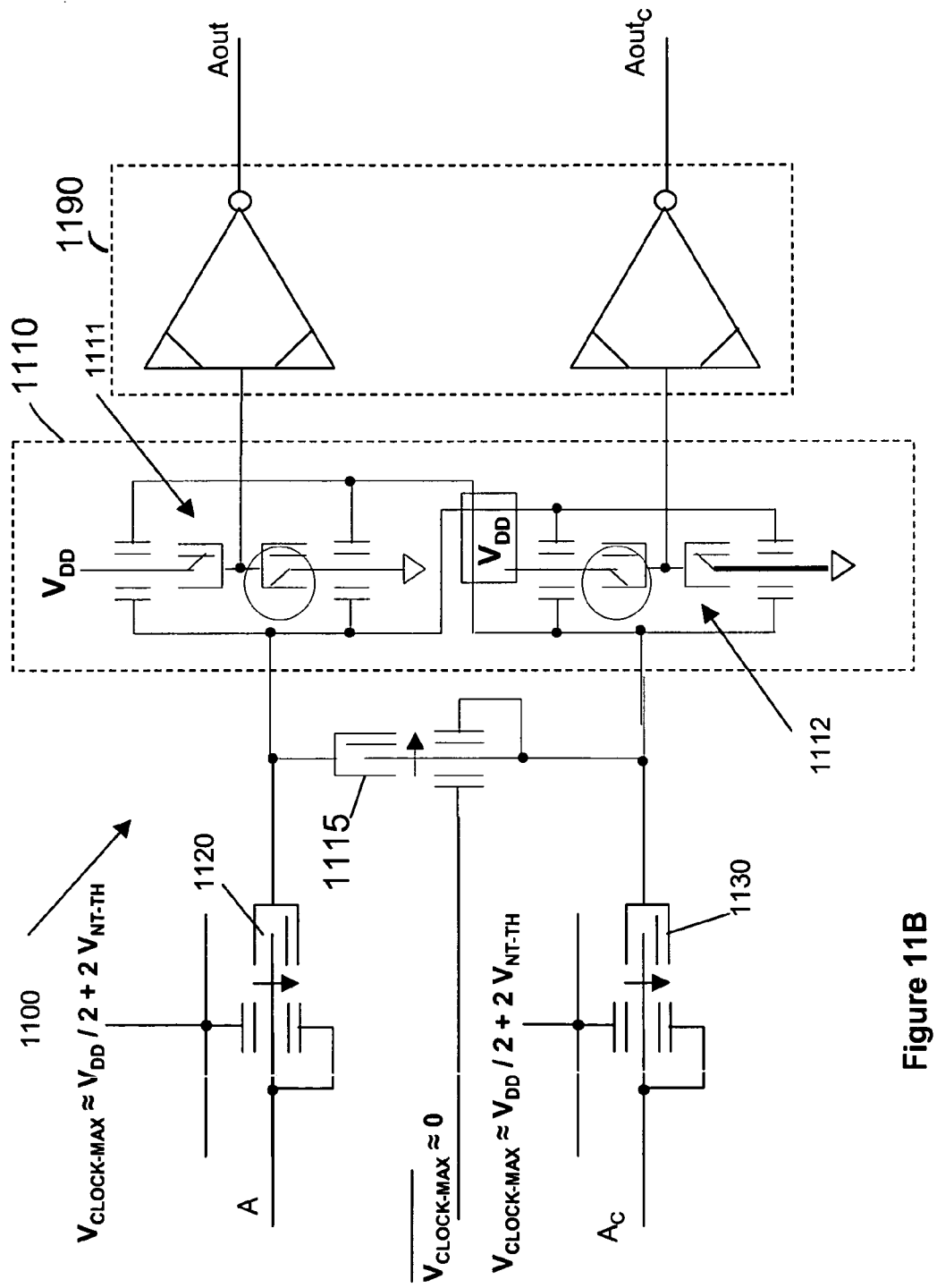
Figure 11C:
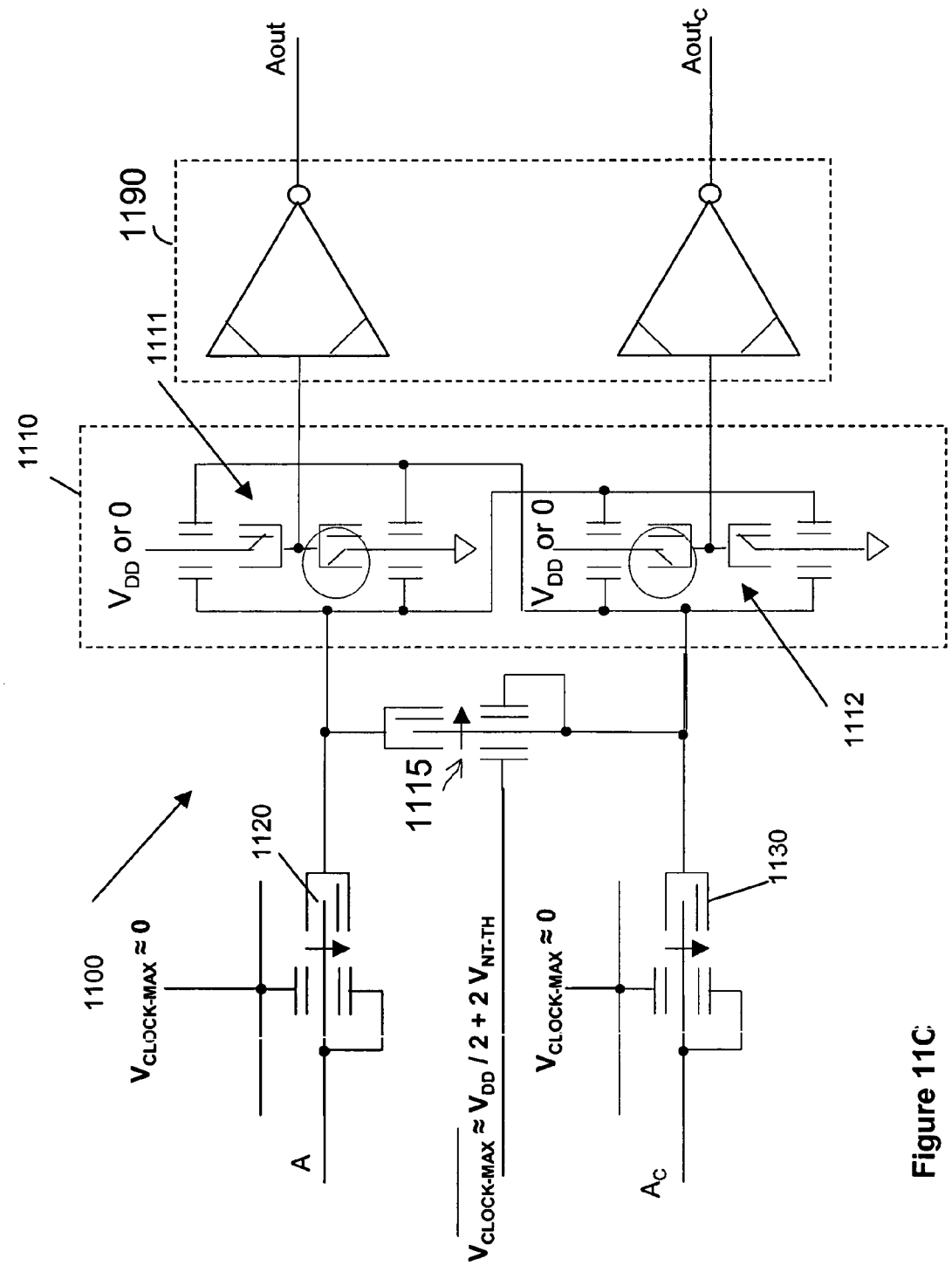

FIGS. 11A-C illustrate a differential-input, differential-output storage device 1100 including a nanotube-based storage element 1110. Storage element 1110 is composed of two nanotube switching element-based inverters 1111 and 1112 that are not cross-coupled. The inverters 1111 and 1112 are non-volatile. The control inputs of inverter 1111 are connected to input signal A; the control inputs of inverter 1112 are connected to input signal $A_C$. The release inputs of inverter 1111 are connected to input signal $A_C$; the release inputs of inverter 1112 are connected to input signal A. The control inputs of inverter 1111 are connected to the release inputs of inverter 1112, and vice versa. Storage device 1100 also includes a differential input buffer provided by first transfer device 1120 and second transfer device 1130. The input buffer is controlled by CLK, which is connected to the control inputs of both transfer devices 1120 and 1130. The storage device also includes an equilibration element 1115 provided by a volatile nanotube switching element. The equilibration element 1115 is activated by $CLK_C$. When CLK is high, input signals A and $A_C$ are provided to the storage element 1110; the two inverters 1111 and 1112 are responsive to and store the input signals. When CLK is low, the input signals A and $A_C$ are blocked by the input buffer by transfer devices 1120 and 1130, and storage element 1110 stores the state provided on the falling edge of CLK. If the input lines to the storage element 1110 are disturbed while CLK is low, however, e.g., by noise, then one or both of the inverter states of storage element 1110 could inadvertently be flipped. Equilibration device 1115, when activated, ties together the inputs (both control and release inputs) to inverters 1111 and 1112 in storage element 1110. Since these inputs are all tied together, the control and release electrode of each nanotube switching element exert opposing forces at any given time, and any disturbances are cancelled out, thus, the stored state within each inverter 1111, 1112 is not affected. The storage device 1100 also has a differential output buffer 1190, connected to the output of storage element 1110. Storage device 1100 has various applications, e.g., it can be used as a latch element in a master-slave latch. FIG. 11B shows the operation of the storage device 1100, when it is being written, i.e., when CLK is high. The circles highlight that a nanotube switching element is activated, i.e., the channel element is deflected. The use of nanotube-based transfer devices in the input buffer requires that the CLK signal be shifted and overdriven as discussed above. FIG. 11C shows the operation of the storage device 1100, when it is in the "store" mode, when CLK is low. The equilibration device 1115 is activated. Because a nanotube-based transfer device is used to provide equilibration device 1165, it is preferred that the device be overdriven by a shifted signal representative of CLK. The stored states within inverters 1111 and 1112 can be maintained until the next write cycle and are protected from change by the equilibration device 1114.

Figure 12A:
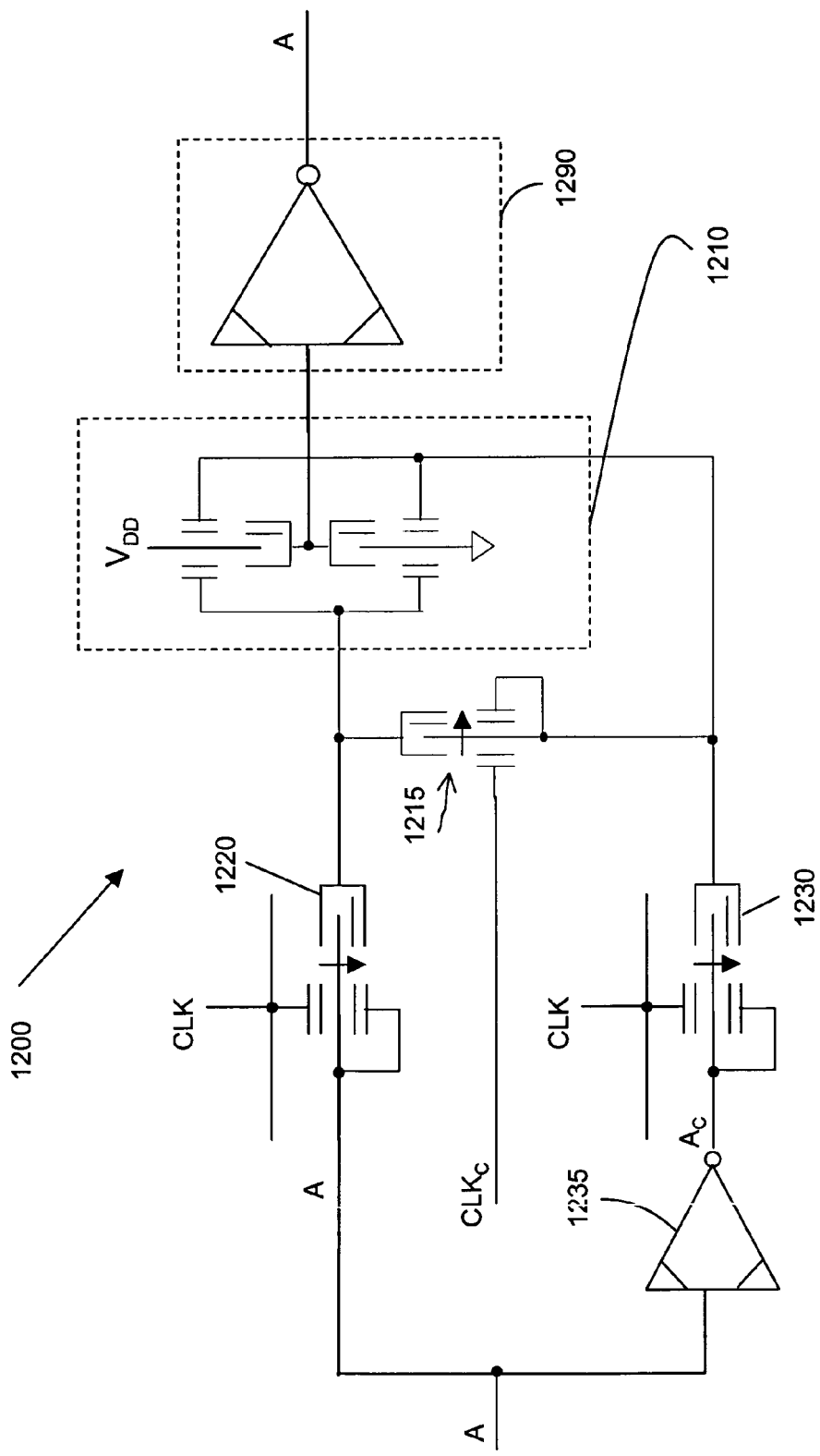
FIGS. 12A-C are schematic illustrations of an exemplary storage device according to an embodiment of the invention.
Figure 12B:
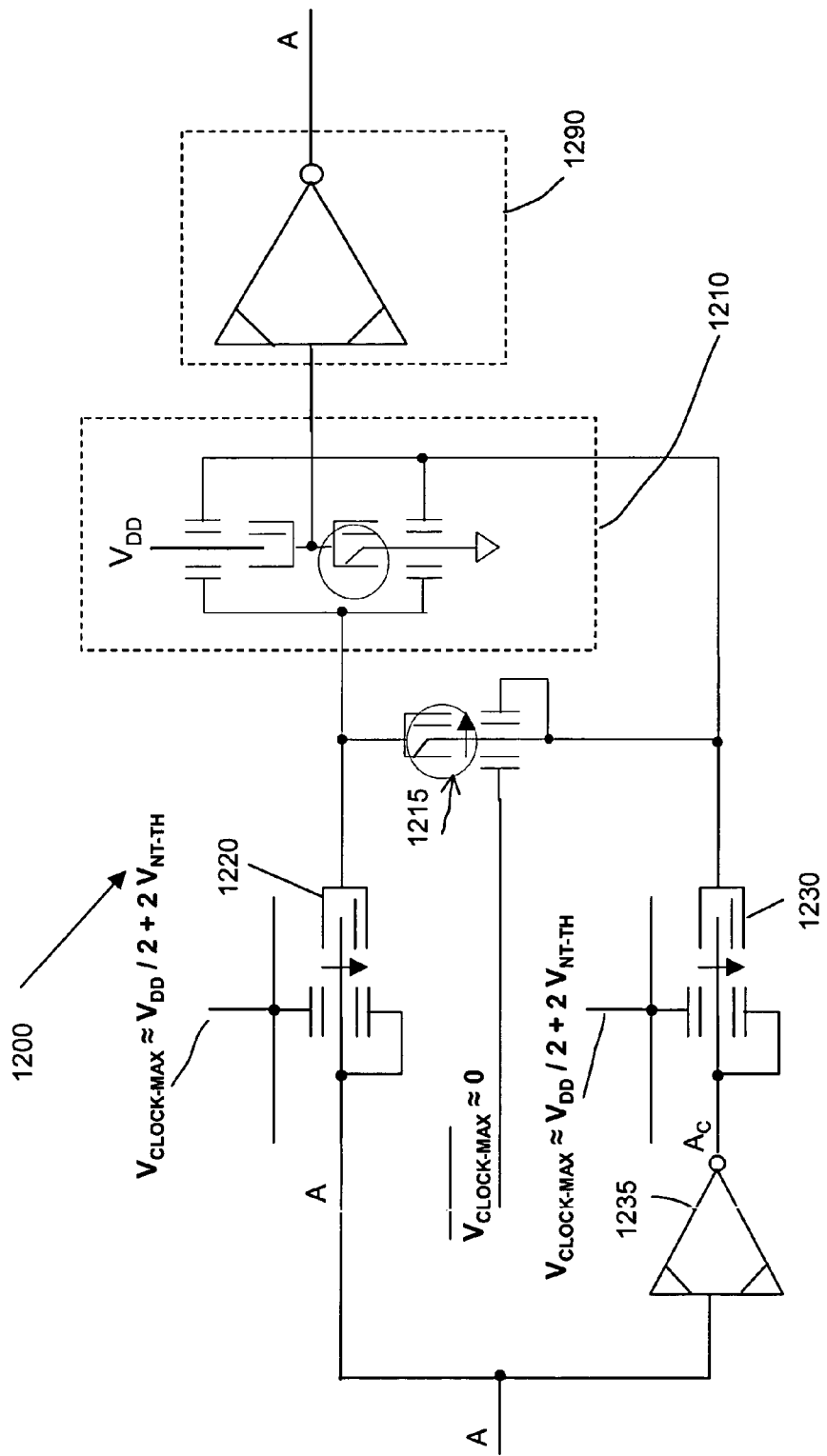
Figure 12C:
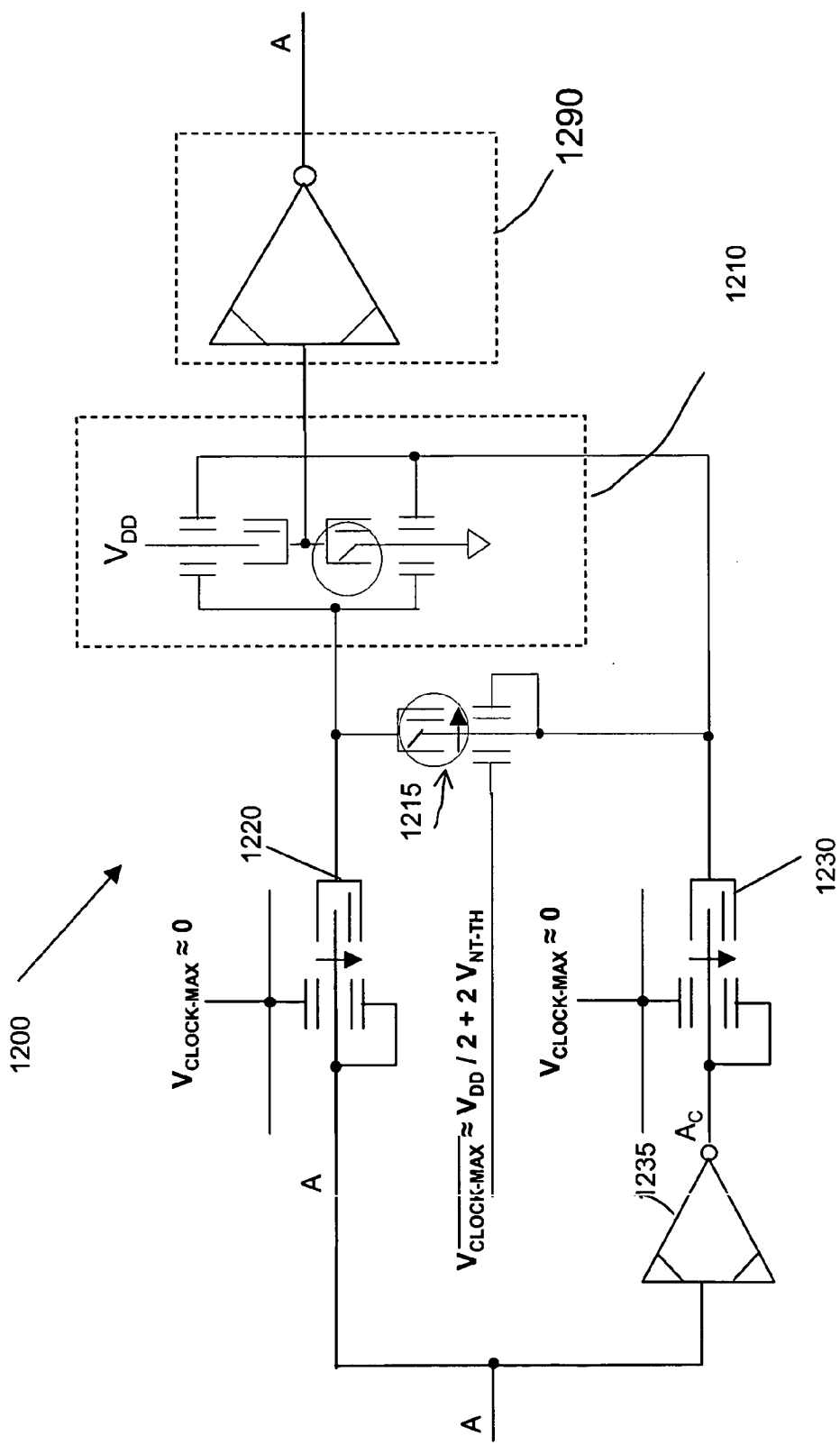

FIGS. 12A-C illustrate a single-input, single-output storage device 1200 in accordance with an embodiment of the invention. Storage device 1200 stores a single value representative of the state of input signal A. Storage device 1200 includes a storage element 1210 comprising a single inverter constructed from non-volatile nanotube switching elements. An inverter 1235 generates $A_C$ in order to provide the differential signal needed to operate storage element 1210. As indicated in the figure, inverter 1235 is a nanotube-based inverter, but could also be provided by MOS or other technology. A differential input buffer provided by transfer devices 1220 and 1230 gates the input signal A and its complement $A_C$ to storage element 1210. A clock signal CLK controls the input buffer. Storage device 1200 also includes an equilibration device 1215. The equilibration device 1215 is activated by $CLK_C$. The equilibration device 1215 maintains the control and release inputs of storage element 1210 at the same potential when device 1200 is in the store state. The internal state remains unchanged even if noise signals are present because the control and release inputs apply opposing forces to the nanotube channel elements. This prevents fluctuations on the inputs from unexpectedly changing the stored data value. Storage device 1200 also includes an output buffer 1290 connected to the output of the storage element 1210. FIGS. 12B and C illustrate the operation of the device 1200. When CLK is high, the device is in a write state; when CLK is low, the device is in a store state and the equilibration device 1215 is activated.

Figure 13A:
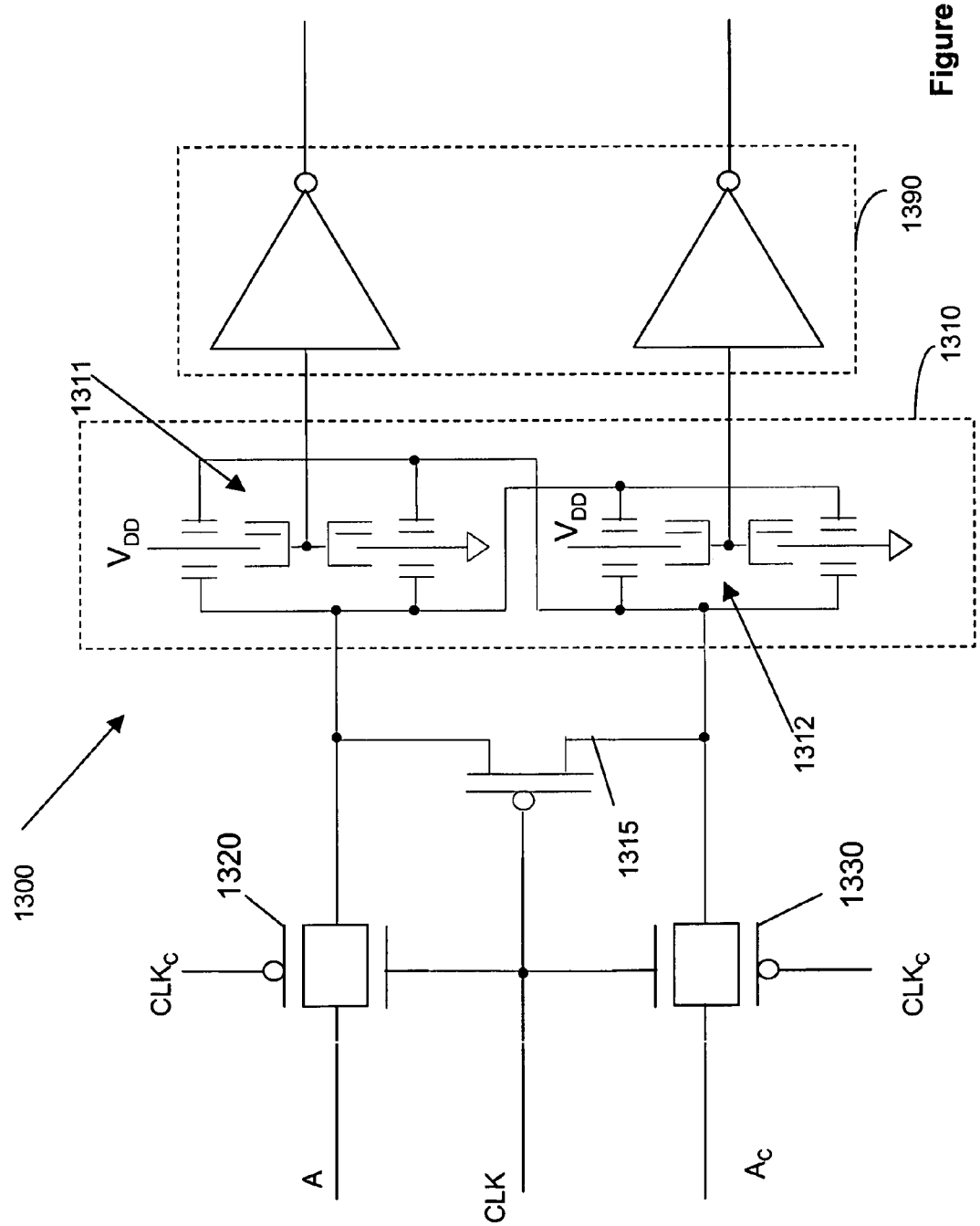
FIGS. 13A-C are schematic illustrations of an exemplary storage device according to an embodiment of the invention.
Figure 13B:
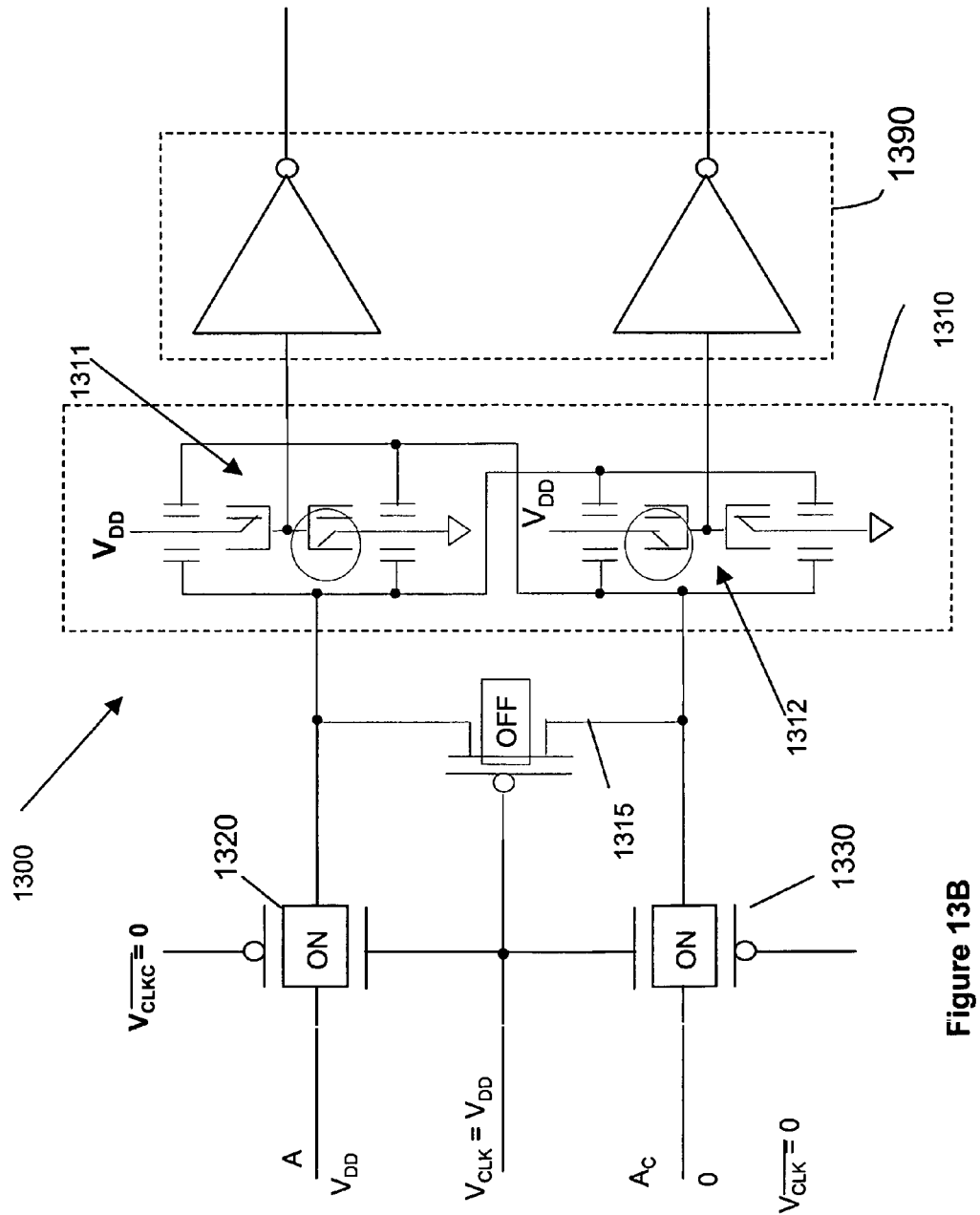
Figure 13C:
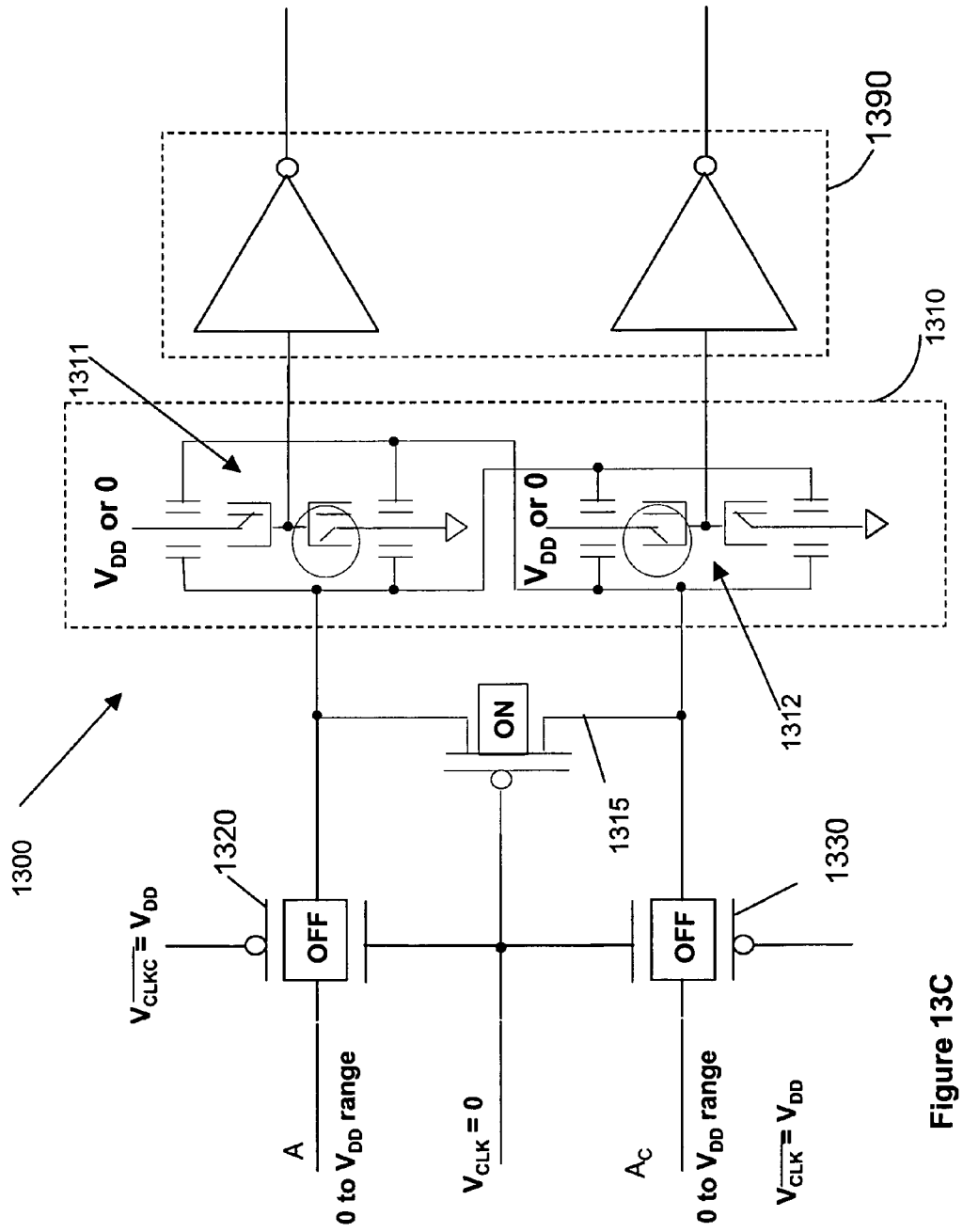

FIGS. 13A-C illustrate a single input, single output storage device 1300 in accordance with an embodiment of the invention. Device 1300 is similar to device 1100, however certain components are provided by MOS elements. Accordingly, device 1300 is a hybrid nanotube and MOS device. In particular, the input buffer is formed of MOS pass transistors 1320 and 1330. Similarly, equilibration element 1315 is an MOS transistor. The use of MOS elements eliminates the need for signal shifting circuitry. FIGS. 13B and C illustrate the operation of the device 1300. When the input buffer is activated, equilibration device 1315 is off. When the input buffer is deactivated, and the device 1300 is in the store state, equilibration device 1315 is on. When it is activated, equilibration device 1315 maintains the control and release inputs of the storage element 1310 at the same potential, so that fluctuations on the inputs are cancelled out and do not affect the stored state. A hybrid implementation may be particularly useful when size is a significant consideration. Nanotube-based and MOS elements can be layered on top of each other, which enables a reduction in the total area required for the device layout.

Preferred embodiments of the invention are compatible with MOS circuits and can be manufactured in an integrated way with MOS circuits. It is contemplated that certain embodiments of the invention can be used interchangeably with existing field effect device implementations, e.g., CMOS implementations. (MOS designs can readily be converted to nanotube switch designs. Storage devices constructed according to the invention can be substituted for MOS cells in larger MOS circuits without impacting other portions of the original design. New designs combining nanotube switch technology with MOS technology can readily be created by using embodiments of present invention with components selected from a MOS device library.

In view of the wide variety of embodiments to which the principles of the present invention can be applied, it should be understood that the illustrated embodiments are exemplary only, and should not be taken as limiting the scope of the present invention. Preferred embodiments use the nanotube-based switches of the incorporated related references. As described therein, many volatile and non-volatile configurations may be used. Combinations of different configurations may also be used. These switches may then be arranged and sized based on the requirements of a particular application, limitations of certain fabrication techniques, etc.

While single walled carbon nanotube channel elements are preferred, multi-walled carbon nanotubes may also be used. Also, nanotubes may be used in conjunction with nanowires. Nanowires as referenced herein includes single nanowires, aggregates of non-woven nanowires, nanoclusters, nanowires entangled with nanotubes comprising a nanofabric, mattes of nanowires, etc. While carbon nanotube channel elements are preferred, it is contemplated that other nanotube channel elements may also be used in some embodiments.

The following patent references refer to various techniques for creating nanotube fabric articles and switches and are assigned to the assignee of this application. Each is hereby incorporated by reference in its entirety:

Electromechanical Memory Having Cell Selection Circuitry Constructed With Nanotube Technology (U.S. Pat. No. 6,643,165), filed on Jul. 25, 2001;

Electromechanical Memory Array Using Nanotube Ribbons and Method for Making Same (U.S. Pat. No. 6,919,592), filed on Jul. 25, 2001;

Hybrid Circuit Having Nanotube Electromechanical Memory (U.S. Pat. No. 6,574,130), filed on Jul. 25, 2001;

Electromechanical Three-Trace Junction Devices (U.S. Pat. No. 6,911,682), filed on Dec. 28, 2001;

Methods of Making Electromechanical Three-Trace Junction Devices (U.S. Pat. No. 6,784,028), filed on Dec. 28, 2001;

Nanotube Films and Articles (U.S. Pat. No. 6,706,402), filed Apr. 23, 2002;

Methods of Nanotube Films and Articles (U.S. Pat. No. 6,835,591), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Electro-Mechanical Switches and Memory Cells Using Horizontally-Disposed Nanofabric Articles and Methods of Making the Same, (U.S. Provisional Patent Application No. 60/446,783), filed Feb. 12, 2003; now Devices Having Horizontally-Disposed Nanofabric Articles and Methods of Making the Same (U.S. patent application Ser. No. 10/776,059), filed Feb. 11, 2004;

Electromechanical Switches and Memory Cells using Vertically-Disposed Nanofabric Articles and Methods of Making the Same (U.S. Provisional Patent Application No. 60/446,786), filed Feb. 12, 2003; now Devices Having Vertically-Disposed Nanofabric Articles and Methods of Making the Same (U.S. Pat. No. 6,924,538), filed Feb. 11, 2004.

Other aspects, modifications, and embodiments are within the scope of the following claims. The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A storage device, comprising:
    a storage element constructed with at least one nanotube switching element having a control electrode and a release electrode; and
    an equilibration device responsive to a control signal that when activated maintains the control electrode and the release electrode at the same potential.

2. The storage device of claim 1, wherein the equilibration device includes a MOS field effect switching element.

3. The storage device of claim 1, wherein the equilibration device includes a nanotube switching element.

4. The storage device of claim 1, wherein the storage element is non-volatile.

5. The storage device of claim 1, wherein the storage element is constructed with non-volatile four-terminal nanotube switching elements.

6. The storage device of claim 1, wherein the storage element is volatile.

* * * * *